(12) United States Patent
Nishida

(10) Patent No.: US 11,552,021 B2
(45) Date of Patent: Jan. 10, 2023

(54) SEMICONDUCTOR DEVICE, SEMICONDUCTOR MANUFACTURING APPARATUS AND METHOD OF MANUFACTURING SEMICONDUCTOR DEVICE HAVING PRINTED CIRCUIT BOARD AND INSULATING BOARD WITH COMPLEMENTARY WARPS

(71) Applicant: FUJI ELECTRIC CO., LTD., Kawasaki (JP)

(72) Inventor: Yuhei Nishida, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 65 days.

(21) Appl. No.: 17/093,998

(22) Filed: Nov. 10, 2020

(65) Prior Publication Data

US 2021/0151378 A1  May 20, 2021

(30) Foreign Application Priority Data

Nov. 19, 2019  (JP) .............................. JP2019-209021

(51) Int. Cl.
*H01L 23/538* (2006.01)
*H01L 21/67* (2006.01)
*H01L 23/498* (2006.01)
*H01L 21/48* (2006.01)

(52) U.S. Cl.
CPC ........ *H01L 23/5385* (2013.01); *H01L 21/486* (2013.01); *H01L 21/4853* (2013.01); *H01L 21/67132* (2013.01); *H01L 21/67288* (2013.01); *H01L 23/4985* (2013.01); *H01L 23/49833* (2013.01); *H01L 23/49838* (2013.01); *H01L 23/5386* (2013.01); *H01L 23/5387* (2013.01)

(58) Field of Classification Search
CPC ........... H01L 23/5385; H01L 23/49833; H01L 23/49838; H01L 23/4985; H01L 23/5387; H01L 21/4853; H01L 21/486; H01L 21/67132; H01L 21/67288
USPC ....................................... 257/697, 734, 735
See application file for complete search history.

(56) References Cited

U.S. PATENT DOCUMENTS

| | | | |
|---|---|---|---|
| 10,923,414 B2 * | 2/2021 | Nakamura | .......... H01L 23/5385 |
| 2013/0285235 A1 | 10/2013 | Murata et al. | |
| 2015/0223339 A1 | 8/2015 | Nakamura et al. | |

FOREIGN PATENT DOCUMENTS

| | | |
|---|---|---|
| JP | 2002164473 A | 6/2002 |
| JP | 2013157377 A | 8/2013 |
| JP | 2013232495 A | 11/2013 |
| JP | 201646509 A | 4/2016 |
| WO | 2014061211 A1 | 4/2014 |

* cited by examiner

Primary Examiner — Quoc D Hoang

(57) ABSTRACT

A semiconductor device includes: a first insulating circuit substrate; a first semiconductor chip mounted on a top surface of the first insulating circuit substrate; a printed circuit board arranged over the first insulating circuit substrate; a first external terminal inserted to the printed circuit board and having one end bonded to the top surface of the first insulating circuit substrate; and a first pin inserted to the printed circuit board and having one end bonded to a top surface of the first semiconductor chip, wherein the first insulating circuit substrate and the printed circuit board having warps complimentary to each other.

9 Claims, 25 Drawing Sheets

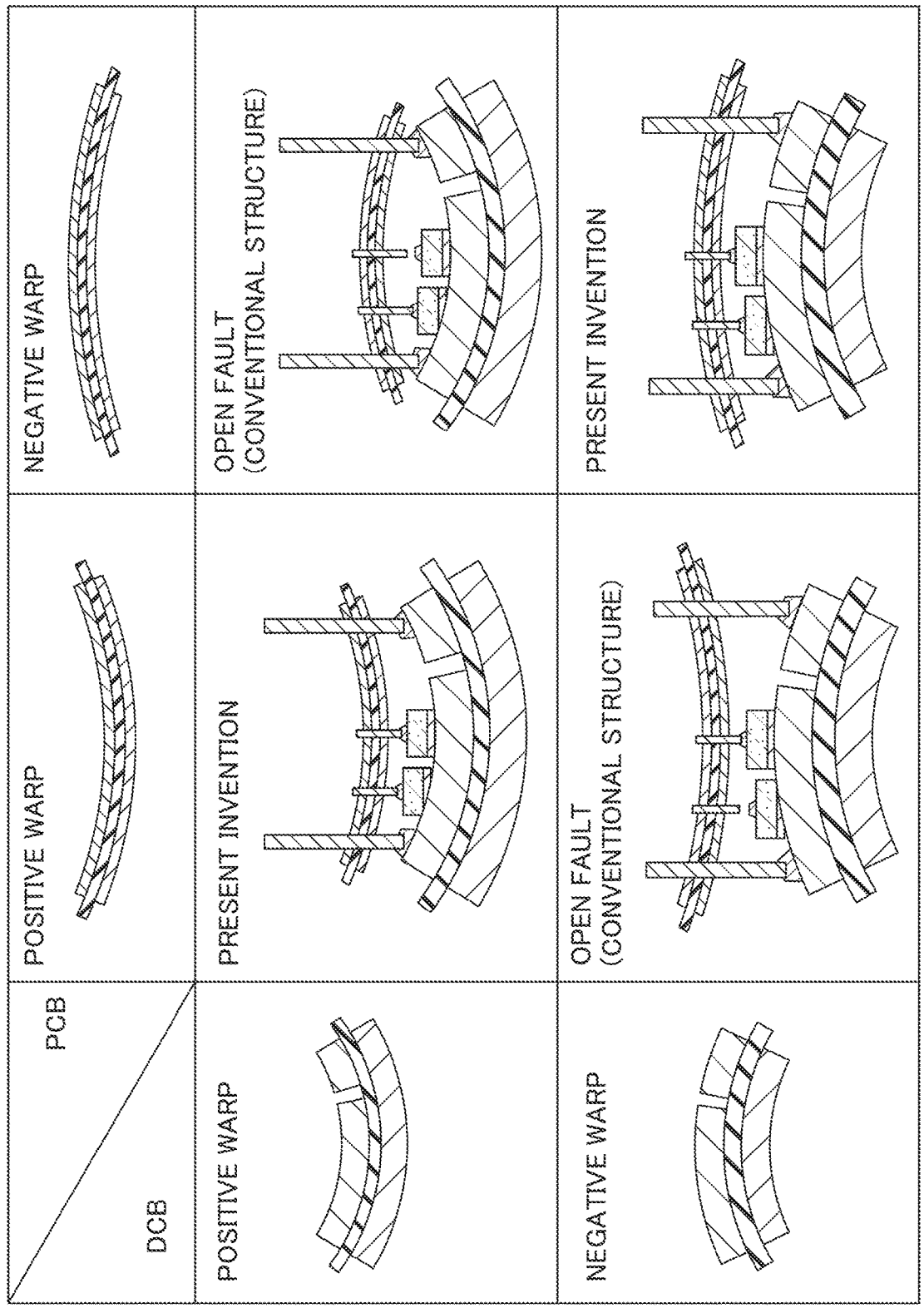

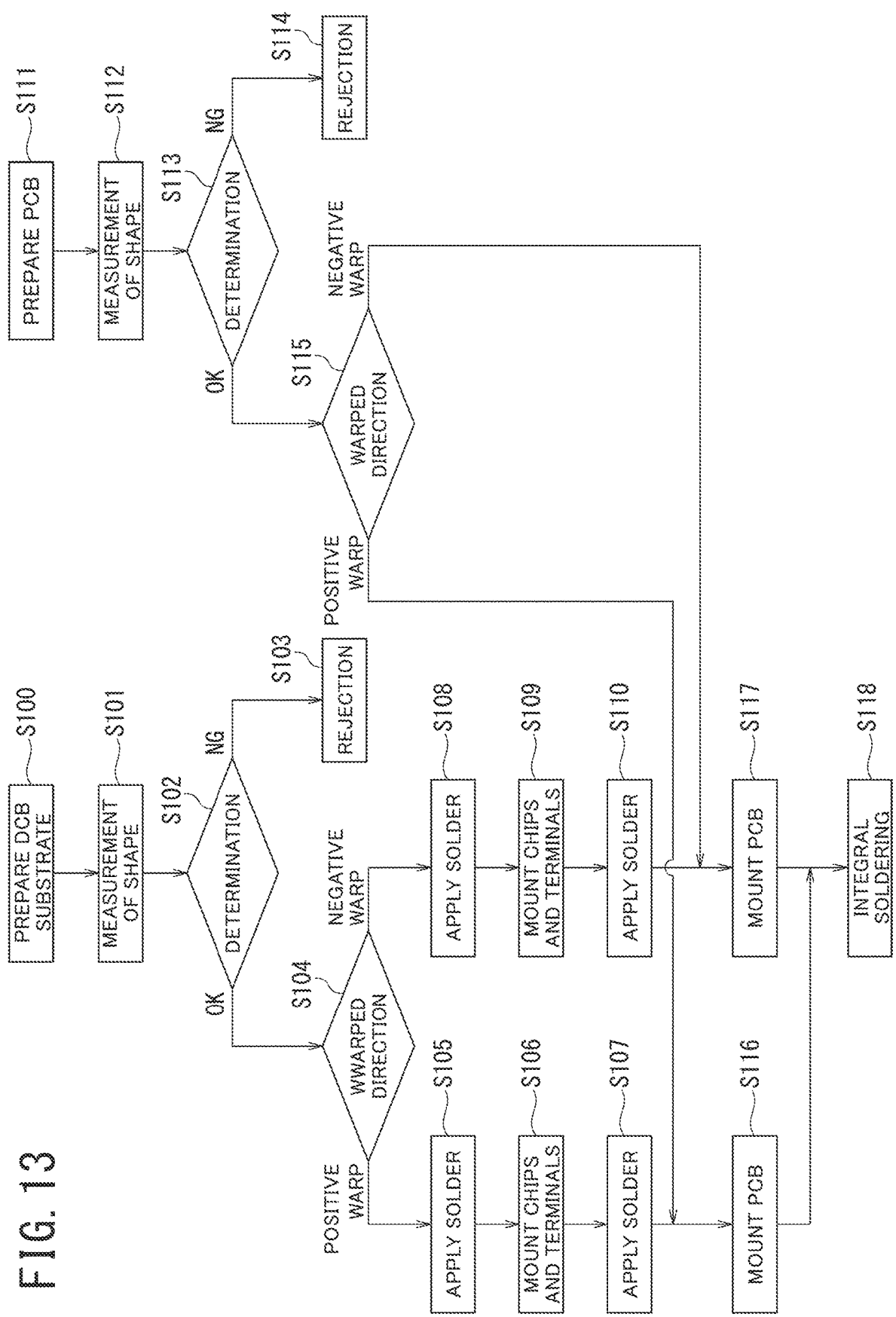

FIG. 28

| PCB / DCB | POSITIVE WARP | NEGATIVE WARP | M-SHAPED | W-SHAPED |
|---|---|---|---|---|
| POSITIVE WARP | (GOOD) | (INFERIOR) | (INFERIOR) | (GOOD) |
| NEGATIVE WARP | (INFERIOR) | (GOOD) | (GOOD) | (INFERIOR) |

SEMICONDUCTOR DEVICE, SEMICONDUCTOR MANUFACTURING APPARATUS AND METHOD OF MANUFACTURING SEMICONDUCTOR DEVICE HAVING PRINTED CIRCUIT BOARD AND INSULATING BOARD WITH COMPLEMENTARY WARPS

CROSS-REFERENCE TO RELATED APPLICATION

This application claims benefit of priority under 35 USC 119 based on Japanese Patent Application No. 2019-209021 filed on Nov. 19, 2019, the entire contents of which are incorporated by reference herein.

BACKGROUND

1. Field of the Invention

The present invention relates to a power semiconductor device (a semiconductor module) including an insulating circuit substrate equipped with power semiconductor chips, and a printed circuit board.

2. Description of the Related Art

Power semiconductor devices are known that include an insulating circuit substrate equipped with power semiconductor chips, and a printed circuit board. A semiconductor device includes pins inserted to a printed circuit board, and one end of the respective pins is bonded to a semiconductor chip via a bonding member such as a solder.

When the semiconductor device is assembled, the printed circuit board and the insulating circuit substrate are sometimes warped due to some reasons derived from a coefficient of thermal expansion, a shape of a wiring pattern, or a difference in thickness of the respective members composing the printed circuit board and the insulating circuit substrate. If a degree of a warp (a distortion) of each of the printed circuit board and the insulating circuit substrate is large, the pins inserted to the printed circuit board and the semiconductor chips mounted on the insulating circuit substrate are separated from each other, which may cause an open fault.

To avoid the occurrence of an open fault, the warped degree of each of the insulating circuit substrate and the printed circuit board at an early stage is measured before the assembly of the semiconductor device, and the warped degree measured is determined whether to be within a standard (upper and lower limits) preliminarily defined according to the records of the warped amount sufficient to avoid an open fault, so as to select the flattest members. The insulating circuit substrate and the printed circuit board, if determined not to meet the standard, need to be rejected, reducing the yield rate accordingly.

JP 2002-164473 A discloses a semiconductor device in which a height of a plurality of external terminals provided on a bottom surface of a wiring substrate convex downward varies so as to be gradually increased from the middle to the outer circumference of the semiconductor device. JP 2013-157377 A discloses a method of reducing voids caused in a solder derived from warps of an insulating substrate provided with a conductive pattern and a copper base by applying a pressure to the insulating substrate provided with the conductive pattern.

WO 2014/061211 A1 discloses a semiconductor module including an insulating substrate equipped with semiconductor chips, and a printed circuit board arranged over the insulating substrate. JP 2013-232495 A discloses a semiconductor device including two heat spreaders equipped with semiconductor elements, and a reinforcing member between the two heat spreaders in order to suppress a warp caused by thermal stress derived from a difference in thermal expansion coefficient between the two heat spreaders and a resin provided between the two heat spreaders.

JP 2016-46509 A discloses that a frame is provided to surround the outer circumference of a printed circuit board in order to suppress a warp of the printed circuit board.

SUMMARY

In view of the foregoing problems, the present invention provides a semiconductor device, a semiconductor manufacturing apparatus, and a method of manufacturing a semiconductor device capable of avoiding an open fault between pins inserted to a printed circuit board and semiconductor chips mounted on an insulating circuit substrate when the printed circuit board and the insulating circuit substrate have warps so as to improve a yield rate.

An aspect of the present invention provides a semiconductor device including: an insulating circuit substrate; a semiconductor chip mounted on a top surface of the insulating circuit substrate; a printed circuit board arranged over the insulating circuit substrate; an external terminal inserted to the printed circuit board and having one end bonded to the top surface of the insulating circuit substrate; and a pin inserted to the printed circuit board and having one end bonded to a top surface of the semiconductor chip, wherein the insulating circuit substrate and the printed circuit board have warps complimentary to each other.

Another aspect of the present invention provides a semiconductor manufacturing apparatus for manufacturing a semiconductor device including an insulating circuit substrate, a semiconductor chip mounted on a top surface of the insulating circuit substrate, a printed circuit board arranged over the insulating circuit substrate, an external terminal inserted to the printed circuit board and having one end bonded to the top surface of the insulating circuit substrate, and a pin inserted to the printed circuit board and having one end bonded to a top surface of the semiconductor chip, the semiconductor manufacturing apparatus including: a measurement unit configured to measure a shape of a plurality of insulating circuit substrates and a shape of a plurality of printed circuit boards; a controller configured to predict a direction of a warp of each of the insulating circuit substrates when heated so as to bond the pin and the semiconductor chip together in accordance with a measurement result of the shape of the respective insulating circuit substrates, and predict a direction of a warp of each of the printed circuit boards when heated in accordance with a measurement result of the shape of the respective printed circuit boards; and an assembly unit configured to choose a combination of the insulating circuit substrate and the printed circuit board with the predicted warps complementary to each other from the plural insulating circuit substrates and the plural printed circuit boards.

Further aspect of the present invention provides a method of manufacturing a semiconductor device including an insulating circuit substrate, a semiconductor chip mounted on a top surface of the insulating circuit substrate, a printed circuit board arranged over the insulating circuit substrate, an external terminal inserted to the printed circuit board and having one end bonded to the top surface of the insulating circuit substrate, and a pin inserted to the printed circuit board and having one end bonded to a top surface of the semiconductor chip, the method including: measuring a shape of a plurality of insulating circuit substrates; measuring a shape of a plurality of printed circuit boards; predicting a direction of a warp of each of the insulating circuit substrates when heated so as to bond the pin and the semiconductor chip together in accordance with a measurement result of the shape of the respective insulating circuit substrates; predicting a direction of a warp of each of the printed circuit boards when heated in accordance with a measurement result of the shape of the respective printed circuit boards; and choosing a combination of the insulating circuit substrate and the printed circuit board with the predicted warps complementary to each other from the plural insulating circuit substrates and the plural printed circuit boards.

BRIEF DESCRIPTION OF THE DRAWINGS

FIG. 7 is a table illustrating a relationship of warps between the printed circuit board and the insulating circuit substrate;

FIG. 13 is a flowchart illustrating a method of manufacturing the semiconductor device according to the first embodiment;

FIG. 28 is a table illustrating a relationship of warps between a printed circuit board and insulating circuit substrates;

DETAILED DESCRIPTION

Figure 1:
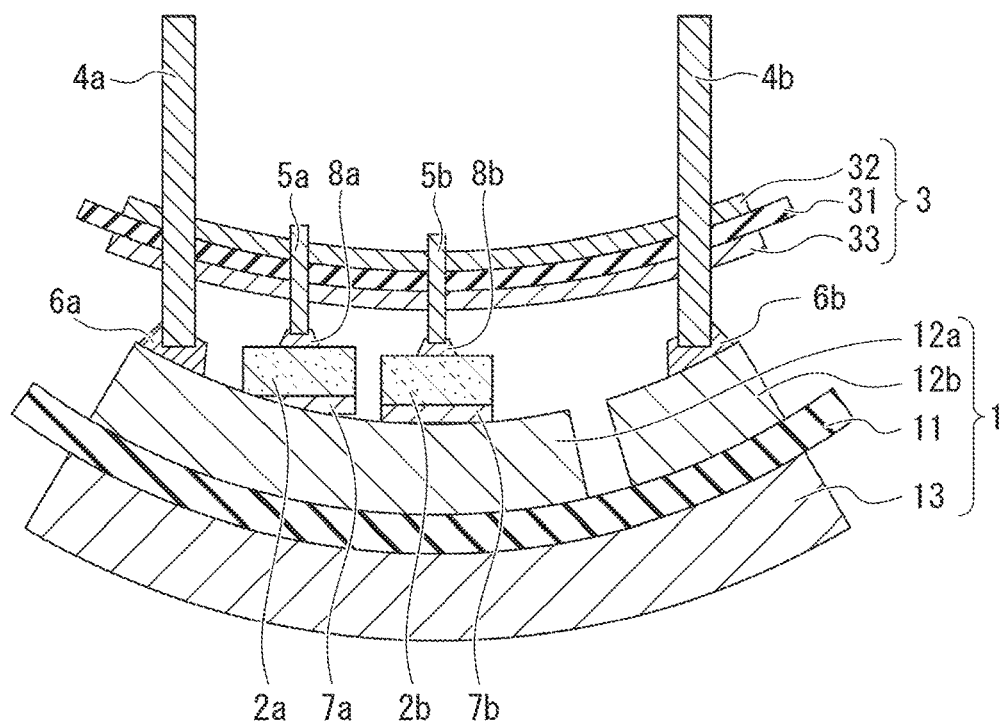
FIG. 1 is a cross-sectional view illustrating a semiconductor device according to a first embodiment.

First and second embodiments will be described below with reference to the drawings. In the explanations of the Drawings below, the same or similar components are denoted by the same or similar reference numerals. The Drawings are illustrated schematically, and relationships between thicknesses and planar dimensions, and proportions of the thicknesses of the respective members are not drawn to scale. It should be understood that the specific thicknesses and dimensions thus should be determined in accordance with the following explanations. It also should be understood that the relationships or proportions of the dimensions between the respective Drawings can differ from each other.

The definitions of directions such as an upper-lower direction described below do not limit the scope of the technical idea of the present invention. For example, the definitions such as a "top" and a "bottom" regarding such as an "upper conductive layer" and a "lower conductive layer" in the following explanations are merely used for illustration purposes, and are not limited to the gravity direction. For example, when the direction of an object is changed by 90 degrees and is then observed, the definitions of the "top" and the "bottom" change to the definitions of the "left" and the "right", and when the direction of the object is changed by 180 degrees, the definitions of the "top" and the "bottom" shall be reversed.

First Embodiment

<Semiconductor Device>

A semiconductor device (a semiconductor module) according to the first embodiment includes an insulating circuit substrate 1, semiconductor elements (semiconductor chips) 2a and 2b mounted on the top surface of the insulating circuit substrate 1, and a printed circuit board 3 arranged to be opposed to the top surface of the insulating circuit substrate 1. The semiconductor device according to the first embodiment implements part of upper and lower arms of a three-phase bridge circuit.

Although not illustrated in FIG. 1, a sealing case may be provided to seal the circumference of the insulating circuit substrate 1 and the printed circuit board 3. A material used for the sealing case may be a hard resin material having high thermal resistance such as thermosetting resin, and specific examples include epoxy resin, maleimide resin, and cyanate resin. The insulating circuit substrate 1 may be provided on the bottom surface with cooling fins attached via a heat-releasing metal base. Alternatively, the bottom surface of the insulating circuit substrate 1 may be directly connected with the cooling fins.

The insulating circuit substrate 1 may be either a direct bonded copper (DCB) substrate or an active metal brazed (AMB) substrate, for example. The insulating circuit substrate 1 includes an insulating substrate 11, upper conductive layers 12a and 12b arranged on the top surface of the insulating substrate 11, and a lower conductive layer 13 arranged on the bottom surface of the insulating substrate 11.

The insulating substrate 11 is a plate-like member including insulating ceramics such as aluminum oxide ($Al_2O_3$), aluminum nitride (AlN), and silicon nitride ($Si_3N_4$). A material used for each of the upper conductive layers 12a and 12b and the lower conductive layer 13 may be a conductive foil such as copper (Cu) and aluminum (Al). While FIG. 1 illustrates the case of including the two upper conductive layers 12a and 12b, the number and the arrangement positions of the upper conductive layers 12a and 12b may be determined as appropriate.

The semiconductor chips 2a and 2b are arranged on the upper conductive layer 12a via bonding members 7a and 7b such as solders. The bonding members 7a and 7b are not limited to the solders, and may be silver (Ag)-based or copper (Cu)-based sintered members.

The semiconductor chips 2a and 2b may each be a transistor such as a MOSFET or an IGBT, or a power semiconductor element such as a thyristor. The semiconductor chips 2a and 2b may each be a silicon (Si) substrate, or a wide-bandgap semiconductor substrate including silicon carbide (SiC) or gallium nitride (GaN), for example. The type, the number and the arrangement positions of the semiconductor chips 2a and 2b may be determined as appropriate.

The printed circuit board 3 includes an insulating layer 31, a first wiring layer 32 deposited on the top surface of the insulating layer 31, and a second wiring layer 33 deposited on the bottom surface of the insulating layer 31. The printed circuit board 3 may be a multi-layer substrate including two or more insulating layers and having a structure in which the insulating layers and the wiring layers are alternately stacked on one another.

The insulating layer 31 may be a resin substrate including a combination of glass fiber and epoxy resin or a combination of a glass fiber and a polyimide resin, for example. The insulating layer 31 may also be a ceramic substrate mainly including $Al_2O_3$, AlN, or $Si_3N_4$.

A material used for each of the first wiring layer 32 and the second wiring layer 33 may be a conductive material such as metal including silver (Ag), copper (Cu), or aluminum (Al). The first wiring layer 32 and the second wiring layer 33 may be a plate of a Cu plate and an Al plate bonded together, or may be plated with Cu, nickel (Ni), or tin (Sn).

The printed circuit board 3 has a plurality of penetration holes (through-holes) penetrating the insulating layer 31, the first wiring layer 32, and the second wiring layer 33. External terminals 4a and 4b are inserted to the penetration holes of the printed circuit board 3. The external terminals 4a and 4b may be inserted to the penetration holes of the printed circuit board 3 with gaps provided, or may be bonded to the penetration holes of the printed circuit board 3 via bonding members such as solders.

The external terminals 4a and 4b can externally extract potential of the semiconductor chips 2a and 2b via the upper conductive layers 12a and 12b, for example, and can externally supply signals to the semiconductor chips 2a and 2b so as to control the semiconductor chips 2a and 2b. A material used for the external terminals 4a and 4b may be a conductive material such as Cu and Al. The external terminals 4a and 4b have a cylindrical shape, for example, or may have any other shape such as a rectangular column shape, a plate-like shape, or a block-like shape. The number and the arrangement positions of the external terminals 4a and 4b may be determined as appropriate.

One end of the external terminal 4a is bonded to the top surface of the upper conductive layer 12a via a bonding member 6a such as a solder. One end of the external terminal 4b is bonded to the top surface of the upper conductive layer 12b via a bonding member 6b such as a solder. The external terminals 4a and 4b, when bonded to the top surfaces of the upper conductive layers 12a and 12b, may be inserted by pressure to openings provided on the upper conductive layers 12a and 12b without the use of the bonding members 6a and 6b so as to be directly bonded to the upper conductive layers 12a and 12b. The semiconductor chips 2a and 2b are arranged toward the middle of the semiconductor device, while the external terminals 4a and 4b are arranged on the circumferential side of the semiconductor device.

A plurality of pins (conductive posts) 5a and 5b are inserted and bonded to the other penetration holes of the printed circuit board 3 different from the penetration holes to which the external terminals 4a and 4b are inserted. A material used for the pins 5a and 5b may be a conductive material such as Cu and Al. The number and the arrangement positions of the pins 5a and 5b may be determined as appropriate. The pins 5a and 5b have a cylindrical shape, for example, or may have any other shape such as a rectangular column shape, a plate-like shape, or a block-like shape. One end of the pin 5a is bonded to an electrode on the top surface of the semiconductor chip 2a via a bonding member 8a such as a solder. One end of the pin 5b is bonded to an electrode on the top surface of the semiconductor chip 2b via a bonding member 8b such as a solder.

Figure 2:
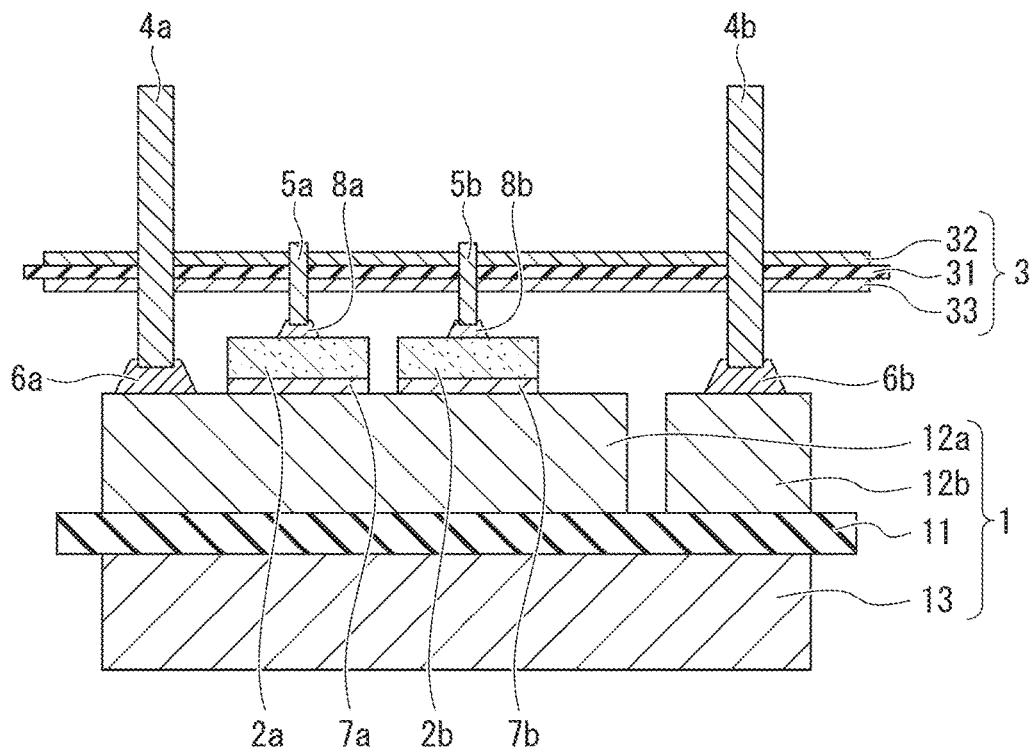
FIG. 2 is a cross-sectional view illustrating a semiconductor device of a comparative example.

FIG. 2 illustrates a semiconductor device of a comparative example, showing a structure in which the insulating circuit substrate 1 and the printed circuit board 3 are both flat. The insulating circuit substrate 1 and the printed circuit board 3, which preferably have a flat structure, may be actually warped due to thermal deformation or an external stress caused during assembling steps in the manufacturing process of the semiconductor device.

For example, the insulating circuit substrate 1 may be thermally warped during a heat processing step such as integral soldering in the manufacturing process, due to the influence of a difference in pattern shape or thickness of the respective layers because of a difference in the coefficient of thermal expansion between the insulating substrate 11 and each of the upper conductive layers 12a and 12b and the lower conductive layer 13 of the insulating circuit substrate 1. The warp of the insulating circuit substrate 1 includes a warp projecting to be curved and convex toward the side (toward the bottom surface side) opposite to the mounted surface side (the top surface side) of the semiconductor chips 2a and 2b (hereinafter referred to also as a "positive warp") as illustrated in FIG. 3A, and a warp projecting to be curved and convex toward the mounted surface side (toward the top surface side) of the semiconductor chips 2a and 2b (hereinafter referred to also as a "negative warp") as illustrated in FIG. 3B.

Figure 3A:
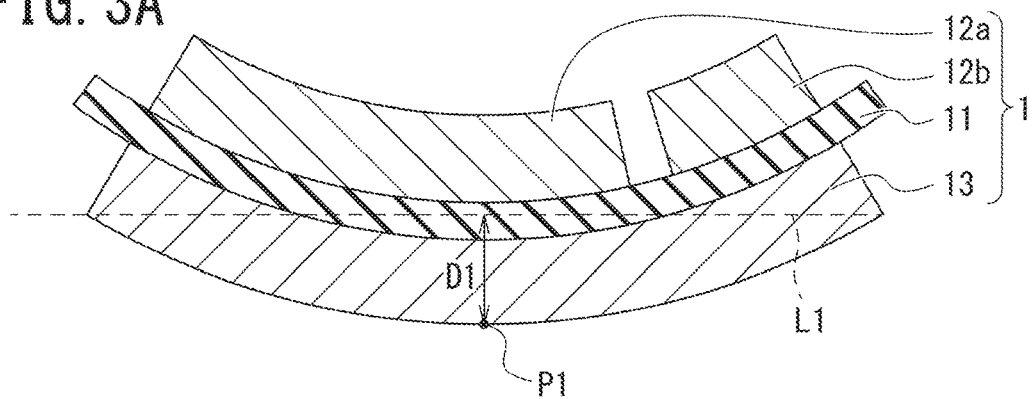
FIG. 3A is a cross-sectional view illustrating an insulating circuit substrate having a positive warp.
Figure 3B:
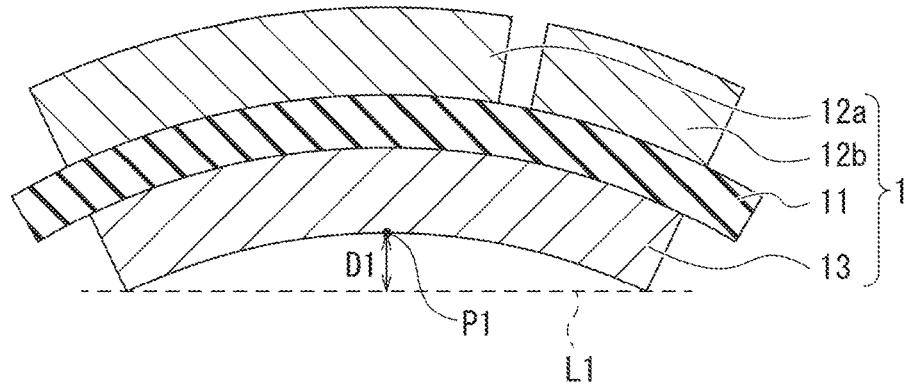
FIG. 3B is a cross-sectional view illustrating an insulating circuit substrate having a negative warp.

The warped direction and the warped amount D1 of the insulating circuit substrate 1 illustrated in FIG. 3A and FIG. 3B can be measured with a laser displacement sensor. For example, the warped direction of the insulating circuit substrate 1 can be obtained according to a positional relation between a straight line L1 connecting the respective ends in a profile on a diagonal line of a rectangular planar pattern of the insulating circuit substrate 1 and a peak position P1 at which the amount of displacement from the height (the reference height) of the straight line L1 is greatest. The warped amount D1 can be obtained as the amount of displacement between the height (the reference height) of the straight line L1 and the peak position P1.

In addition, the printed circuit board 3 may be thermally warped in the manufacturing process due to the influence of a difference in pattern shape or thickness of the respective layers because of a difference in the coefficient of thermal expansion between the insulating layer 31 and each of the first wiring layer 32 and the second wiring layer 33. The warp of the printed circuit board 3 includes a warp projecting to be curved and convex toward the side (toward the bottom surface side) facing the semiconductor chips 2a and 2b (hereinafter referred to also as a "positive warp") as illustrated in FIG. 4A, and a warp projecting to be curved and convex toward the opposite side of the semiconductor chips 2a and 2b (toward the top surface side) (hereinafter referred to also as a "negative warp") as illustrated in FIG. 4B.

Figure 4A:
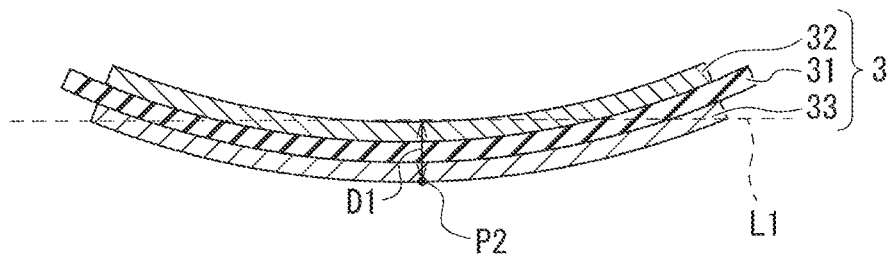
FIG. 4A is a cross-sectional view illustrating a printed circuit board having a positive warp.
Figure 4B:
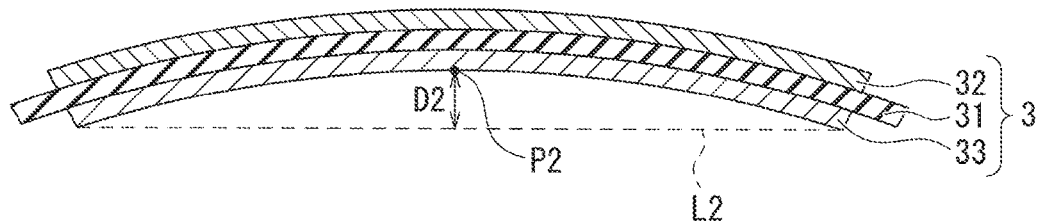
FIG. 4B is a cross-sectional view illustrating a printed circuit board having a negative warp.

The warped direction and the warped amount D2 of the printed circuit board 3 illustrated in FIG. 4A and FIG. 4B can be measured with a laser displacement sensor, as in the case of the warped amount D1 of the insulating circuit substrate 1. For example, the warped direction of the printed circuit board 3 can be obtained according to a positional relation between a straight line L2 connecting the respective ends in a profile on a diagonal line of a rectangular planar pattern of the printed circuit board 3 and a peak position P2 at which the amount of displacement from the height (the reference height) of the straight line L2 is greatest. The warped amount D2 can be obtained as the amount of displacement between the height (the reference height) of the straight line L2 and the peak position P2.

As illustrated in FIG. 1, the semiconductor device according to the first embodiment has a structure in which the insulating circuit substrate 1 and the printed circuit board 3 are both warped. The insulating circuit substrate 1 and the printed circuit board 3 have warps which are complementary to each other. Namely, the insulating circuit substrate 1 and the printed circuit board 3 both have a positive warp so that the warped direction of the insulating circuit substrate 1 and the warped direction of the printed circuit board 3 conform to each other. This enables the insulating circuit substrate 1 and the printed circuit board 3 to come close to each other within a predetermined gap, and can avoid an open fault between the pins 5a and 5b and the semiconductor chips 2a and 2b, so as to ensure electrical conductivity.

Figure 5:
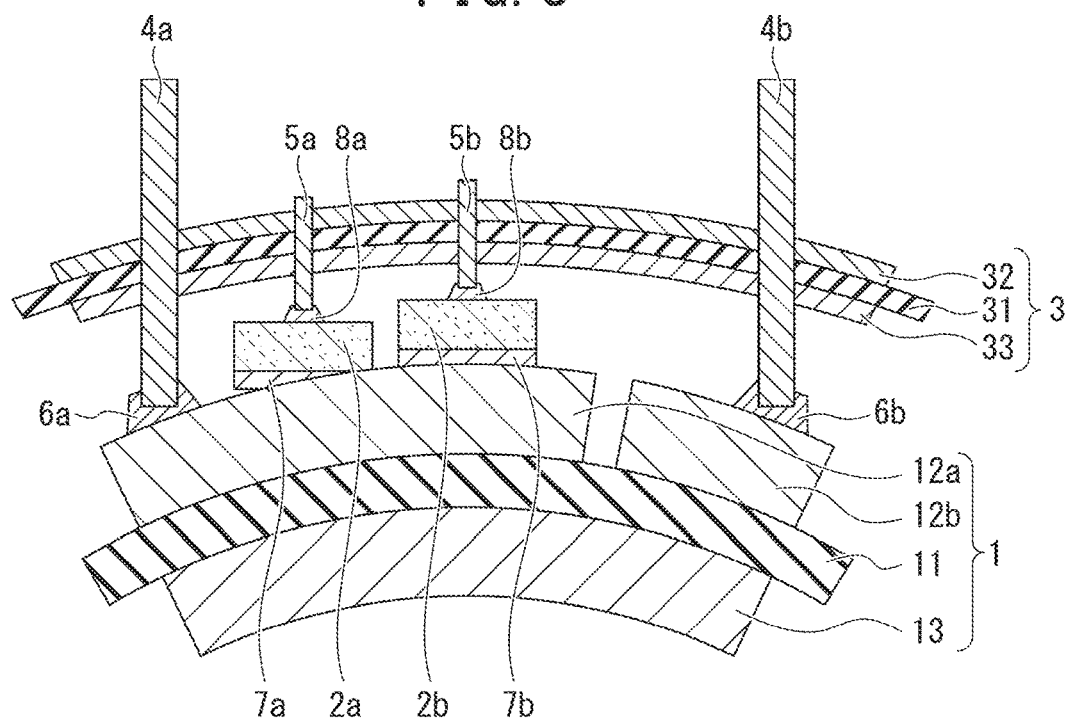
FIG. 5 is a cross-sectional view illustrating a semiconductor device according to a modified example of the first embodiment.

The semiconductor device according to the first embodiment may have a configuration in which the insulating circuit substrate 1 and the printed circuit board 3 both have a negative warp, as illustrated in FIG. 5. The insulating circuit substrate 1 and the printed circuit board 3 in this case also have the warps complementary to each other so that the respective warped directions conform to each other. The negative warp of each of the insulating circuit substrate 1 and the printed circuit board 3 enables the insulating circuit substrate 1 and the printed circuit board 3 to come close to each other within a predetermined gap, and can avoid an open fault between the pins 5a and 5b and the semiconductor chips 2a and 2b, so as to ensure the electrical conductivity.

Semiconductor devices of comparative examples are described below with reference to FIG. 6A and FIG. 6B. A semiconductor device of a comparative example illustrated in FIG. 6A differs from the semiconductor device according to the first embodiment illustrated in FIG. 1 in having a structure in which the insulating circuit substrate 1 has a positive warp and the printed circuit board 3 has a negative warp. Since the insulating circuit substrate 1 and the printed circuit board 3 are warped in the opposite directions in the semiconductor device of the comparative example as illustrated in FIG. 6A, the gap between the insulating circuit substrate 1 and the printed circuit board 3 on the middle side is greater, causing an open fault between the pin 5b and the semiconductor chip 2b located on the middle side.

Figure 6A:
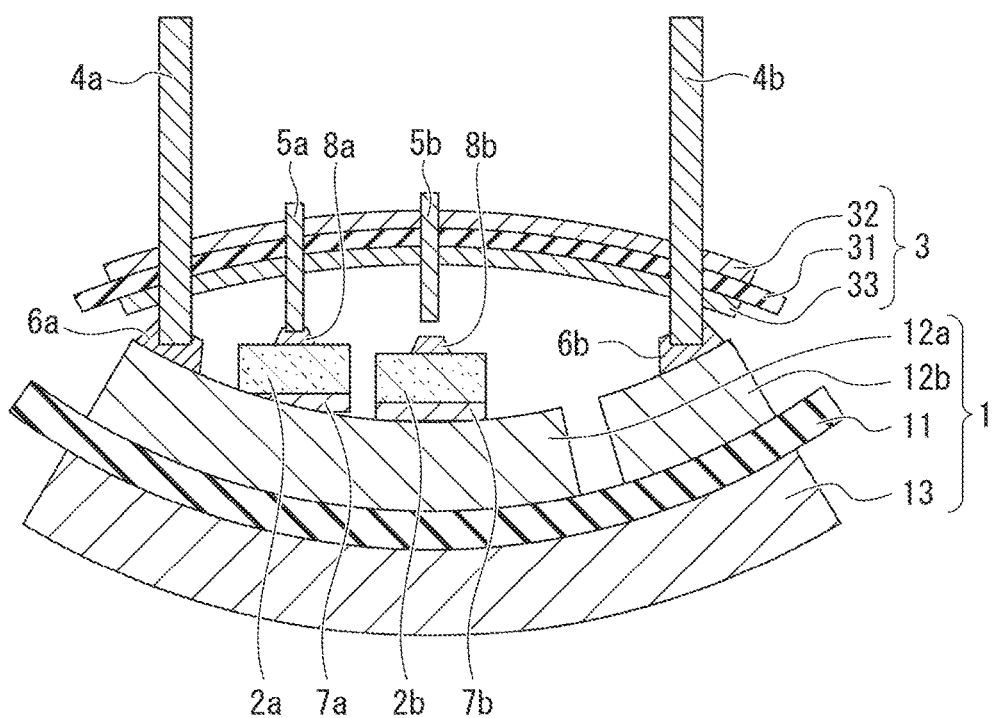
FIG. 6A is a cross-sectional view illustrating a semiconductor device of a comparative example.
Figure 6B:
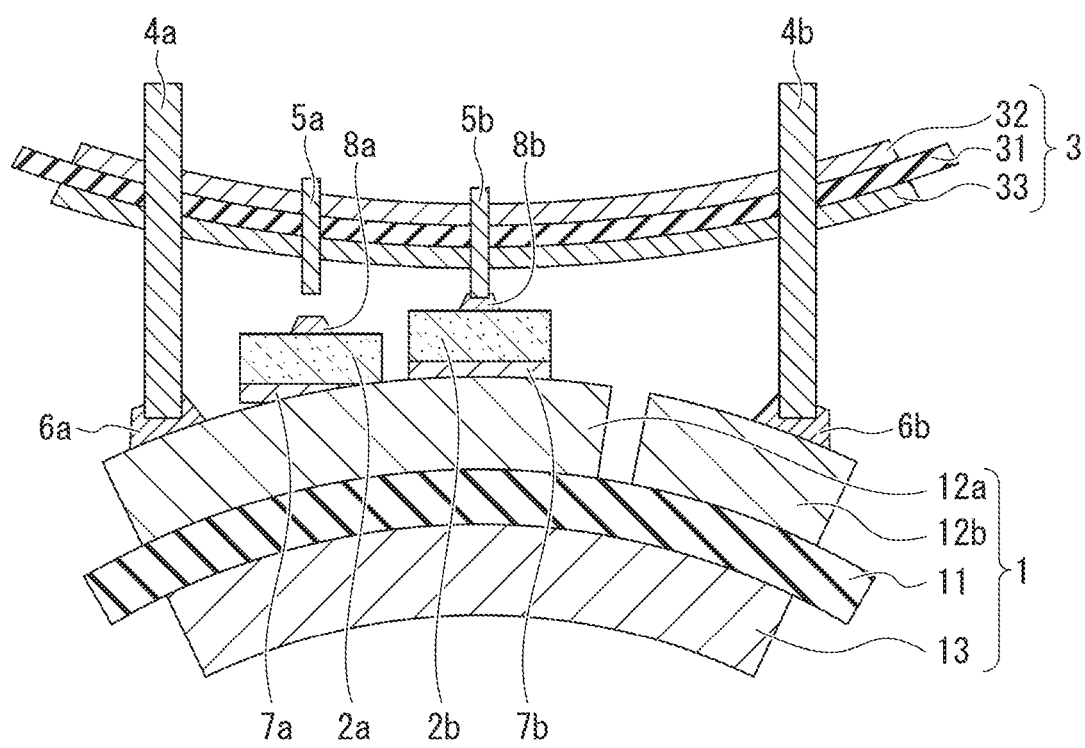
FIG. 6B is a cross-sectional view illustrating a semiconductor device of a comparative example.

A semiconductor device of another comparative example illustrated in FIG. 6B differs from the semiconductor device according to the first embodiment illustrated in FIG. 1 in having a structure in which the insulating circuit substrate 1 has a negative warp and the printed circuit board 3 has a positive warp. Since the insulating circuit substrate 1 and the printed circuit board 3 are warped in the opposite directions in the semiconductor device of the comparative example as illustrated in FIG. 6B, the gap between the insulating circuit substrate 1 and the printed circuit board 3 on the outer circumferential side is greater, causing an open fault between the pin 5a and the semiconductor chip 2a located on the outer circumferential side.

In contrast to the semiconductor devices of the respective comparative examples illustrated in FIG. 6A and FIG. 6B, the semiconductor device according to the first embodiment has the structure in which the respective warps of the insulating circuit substrate 1 and the printed circuit board 3 are complementary to each other, as illustrated in FIG. 1 or FIG. 5, so as to lead the insulating circuit substrate 1 and the printed circuit board 3 to come close to each other within a predetermined gap. This can avoid an open fault between the pins 5a and 5b and the semiconductor chips 2a and 2b, so as to ensure the electrical conductivity.

FIG. 7 is a table illustrating a relationship between the respective warps of the insulating circuit substrate 1 (indicated by "DCB" in FIG. 7) and the printed circuit board 3 (indicated by "PCB" in FIG. 7), corresponding to the respective structures illustrated in FIG. 1, FIG. 5, FIG. 6A and FIG. 6B. An open fault can be avoided when the insulating circuit substrate 1 and the printed circuit board 3 each have a positive warp or a negative warp. An open fault is caused in the case in which one of the insulating circuit substrate 1 and the printed circuit board 3 has a positive warp and the other one has a negative warp.

Figure 8:
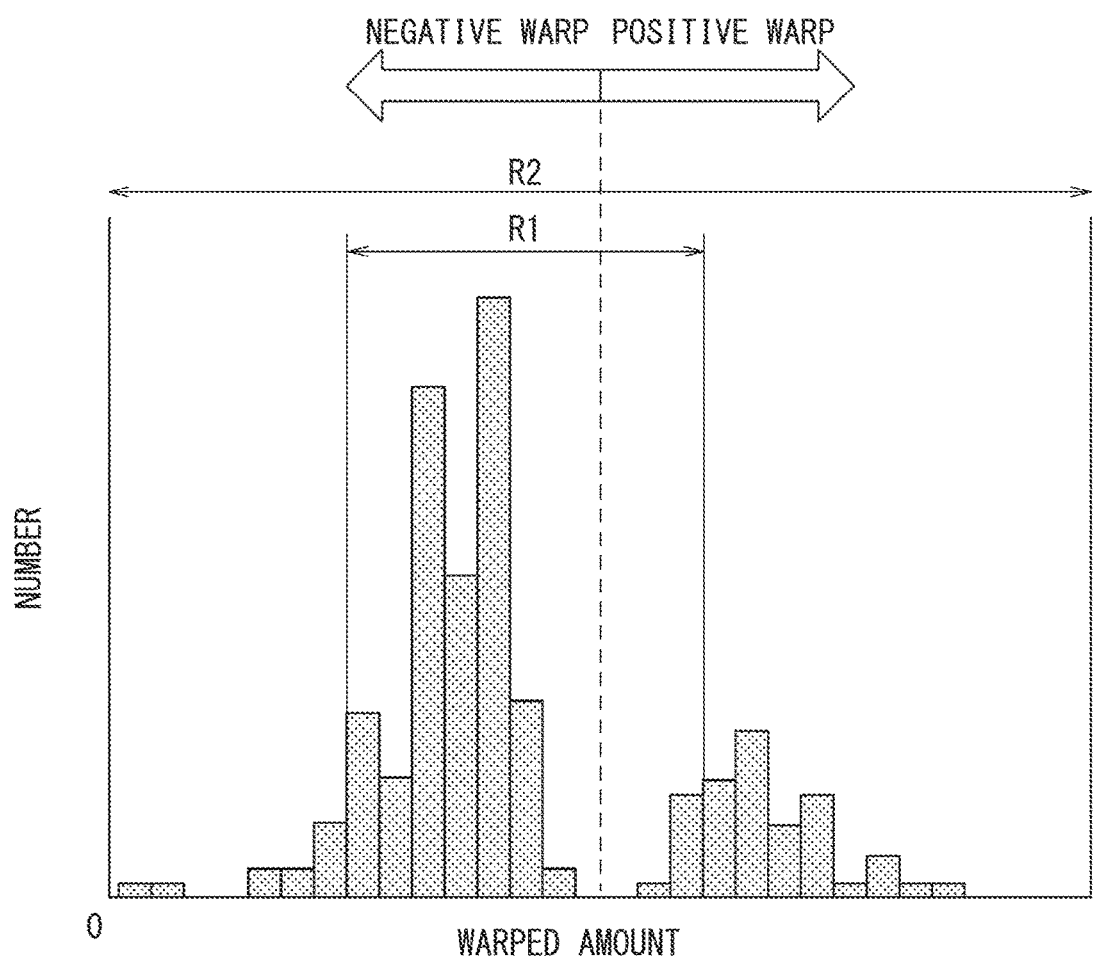
FIG. 8 is a graph illustrating a relationship between the warped amount of the insulating circuit substrate and the number.

FIG. 8 illustrates a relationship between the warped amount and the number of the insulating circuit substrates 1 before a soldering step. The conventional semiconductor device sets a standard (an allowable range) R1 for the warped amount of the insulating circuit substrate 1 so as not to cause an open fault if the printed circuit board 3 and the insulating circuit substrate 1 having different warps in the opposite directions are combined, and selects the flattest insulating circuit substrate 1. The standard is also set for the printed circuit board 3 in the same manner. The conventional case thus results in a reduction in the rate of good-quality products of the printed circuit board 3 and the insulating circuit substrate 1, reducing the yield rate accordingly.

In contrast, the method of manufacturing the semiconductor device according to the first embodiment combines the printed circuit board 3 and the insulating circuit substrate 1, when both warped, in which the respective warps are complementary to each other (the warped directions conform to each other), so as to avoid an open fault. The method thus can set a standard (an allowable range) R2 for the warped amount which is relaxed more than the standard (the allowable range) R1. The standard can be also set for the printed circuit board 3 in the same manner. The rate of good-quality products of the printed circuit board 3 and the insulating circuit substrate 1 thus can be improved, so as to increase the yield rate accordingly.

<Semiconductor Manufacturing Apparatus>

Figure 9:
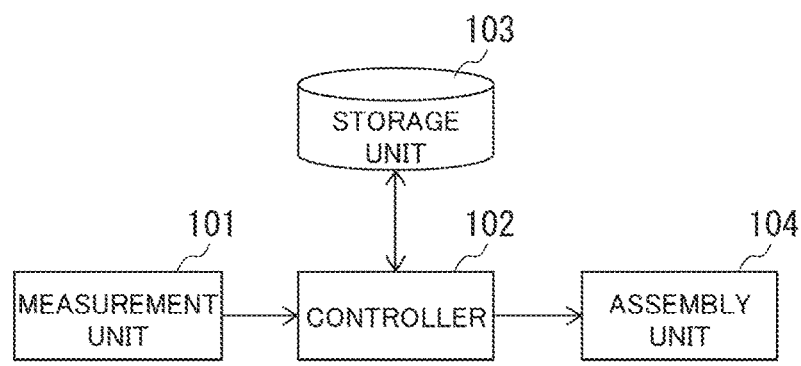
FIG. 9 is a schematic diagram illustrating a semiconductor manufacturing apparatus according to the first embodiment.

Next, an example of a semiconductor manufacturing apparatus of manufacturing the semiconductor device according to the first embodiment is described below. The semiconductor manufacturing apparatus includes a measurement unit 101, a controller 102, a storage unit 103, and an assembly unit 104, as illustrated in FIG. 9.

The measurement unit 101 can be a laser displacement sensor, for example. The measurement unit 101 measures a configuration including the warped direction and the warped amount for a plurality of insulating circuit substrates each corresponding to the insulating circuit substrate 1 as illustrated in FIG. 1. The measurement unit 101 also measures a configuration including the warped direction and the warped amount for a plurality of printed circuit boards to which pins are inserted each corresponding to the printed circuit board 3 to which the pins 5a and 5b are inserted as illustrated in FIG. 1. The measurement unit 101 may measure a configuration of the printed circuit boards to which no pins are inserted, or measure a configuration of the printed circuit boards to which the external terminals are inserted to be bonded in addition to the pins.

The storage unit 103 is a semiconductor memory or a disc medium, for example, and may include a storage medium such as ROM and RAM used as a register, a cache memory, and a main storage device. The storage unit 103 may be partly or entirely installed in the controller 102. The storage unit 103 stores information on warps for the respective types of the insulating circuit substrates, the information including a change in temperature regarding the warped amount of each insulating circuit substrate, a standard for a warp at a room temperature of each insulating circuit substrate, and a standard for a warp at a melting point of solder of each insulating circuit substrate. The storage unit 103 also stores information on warps for the respective types of the printed circuit boards, the information including a change in temperature regarding the warped amount of each printed circuit board, a standard for a warp at a room temperature of each printed circuit board, and a standard for a warp at a melting point of solder of each printed circuit board.

The controller 102 is a processing circuit for executing processing necessary for the operations performed by the semiconductor manufacturing apparatus according to the first embodiment, and may include a processor, a storage device, and an input/output interface, for example. The processor can be implemented by a microprocessor equivalent to a central processing unit (CPU) including an arithmetic logic unit (ALU), a control circuit (a control device), and various kinds of registers.

The controller 102 refers to the information on warps stored in the storage unit 103 so as to predict the respective warps of the insulating circuit substrate and the printed circuit board during the soldering step (at a melting point of solder) in accordance with the measurement results of the configurations of the insulating circuit substrate and the printed circuit board obtained by the measurement unit 101. The controller 102 determines whether the warped amount of each of the insulating circuit substrate and the printed circuit board predicted is within a standard (an allowable range) stored in the storage unit 103. The standard is determined individually for the insulating circuit substrate and the printed circuit board. The controller 102 also determines the respective warped directions of the insulating circuit substrate and the printed circuit board determined to be within the standard.

The assembly unit 104 may include various kinds of devices for assembling the semiconductor device. The assembly unit 104 includes an actuator which selects and combines the insulating circuit substrate and the printed circuit board having the warps complementary to each other, in accordance with the determination results obtained by the controller 102.

Figure 10:
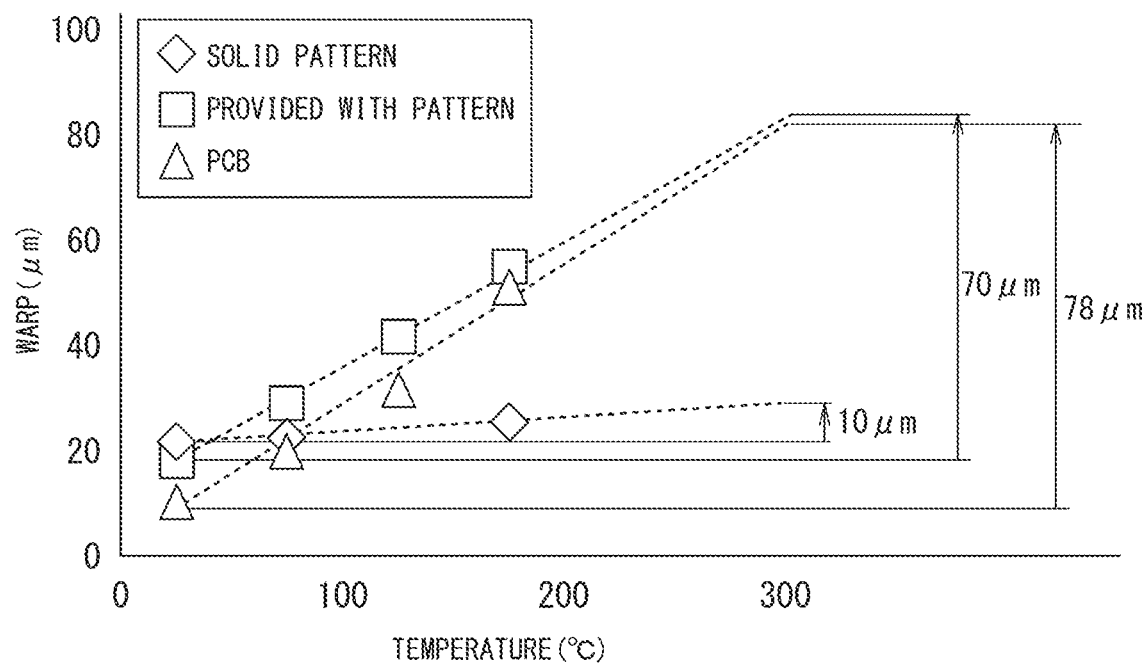
FIG. 10 is a table illustrating a change in temperature of warps of the printed circuit board and the insulating circuit substrate.

Next, a method of determining the warped amount and the warped direction of each of the insulating circuit substrate 1 and the printed circuit board 3 by the controller 102 is described below. FIG. 10 is a table showing a change in temperature when warped in each case of the insulating circuit substrate in which the upper conductive layer and the lower conductive layer have a solid pattern and have the same thickness (indicated by "SOLID PATTERN" in FIG. 10), the insulating circuit substrate in which the lower conductive layer has a solid pattern and the upper conductive layer has a cut pattern (indicated by "PROVIDED WITH PATTERN" in FIG. 10), and the printed circuit board (indicated by "PCB" in FIG. 10).

As shown in FIG. 10, the insulating circuit substrate of the case "PROVIDED WITH PATTERN" is easily deformed and warped in the positive direction when heated because of an influence of a difference in volume of the upper conductive layer, as compared with the case "SOLID PATTERN". In view of this, a change in the warped amount at a temperature between the room temperature and the melting point of solder is obtained through analysis or experiments, so as to choose the combination of the insulating circuit substrate and the printed circuit board presumed to have warps complementary to each other during the soldering step.

Figure 11A:
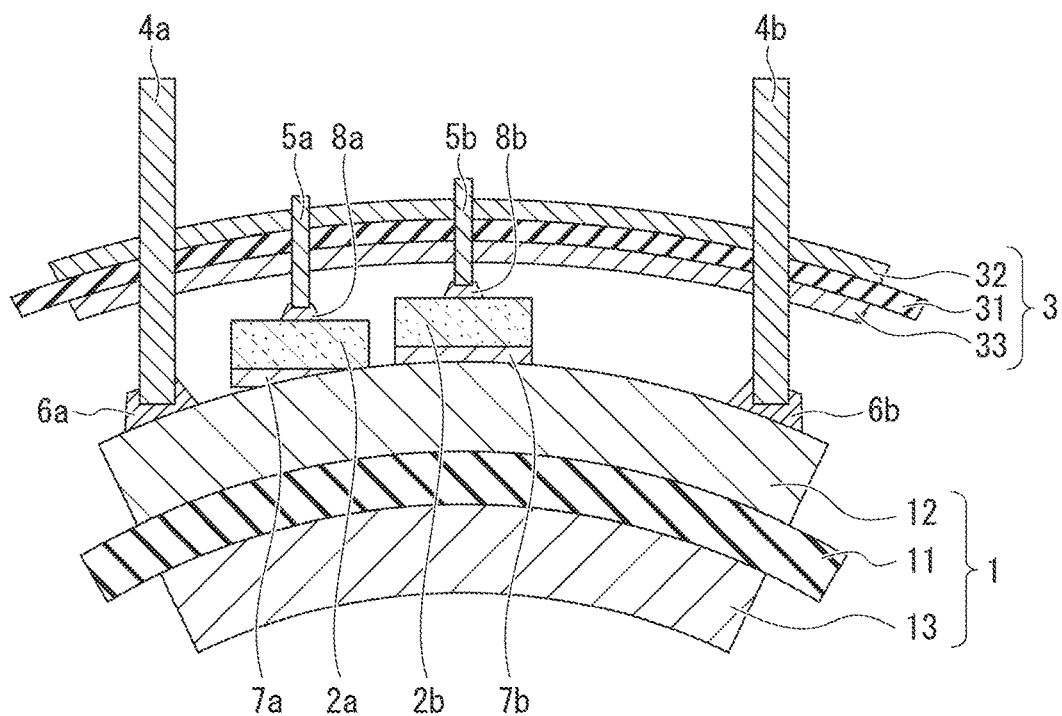
FIG. 11A is a cross-sectional view illustrating a semiconductor device before integral soldering bonding.
Figure 11B:
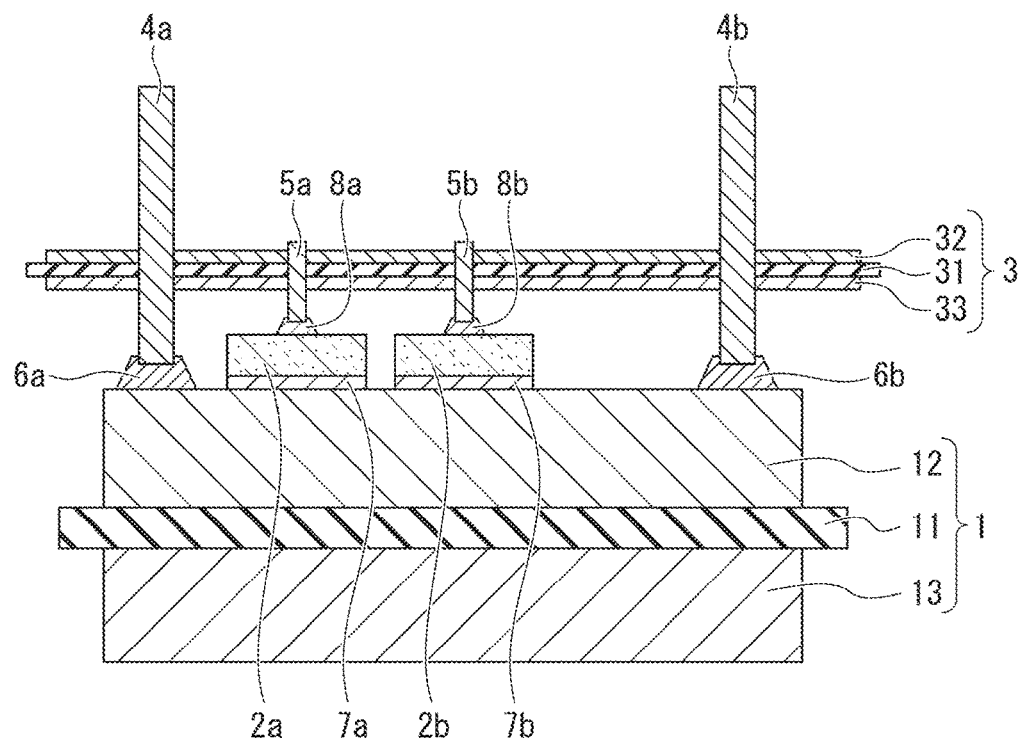
FIG. 11B is a cross-sectional view illustrating the integral soldering bonding of the semiconductor device shown in FIG. 11A.

For example, when a printed circuit board having the same size as that in which the amount of change in warp is 70 micrometers at the temperature between the room temperature and the melting point of solder is mounted on an insulating circuit substrate corresponding to the case "SOLID PATTERN" in which the amount of change in the warp is 10 micrometers, the insulating circuit substrate 1 with the warp of −10 micrometers at the room temperature is combined with the printed circuit board 3 with the warp of −70 micrometers at the room temperature, as illustrated in FIG. 11A. In this case, as illustrated in FIG. 11B, the insulating circuit substrate 1 and the printed circuit board 3 both have the warp of zero micrometers at the melting point of solder.

Figure 12A:
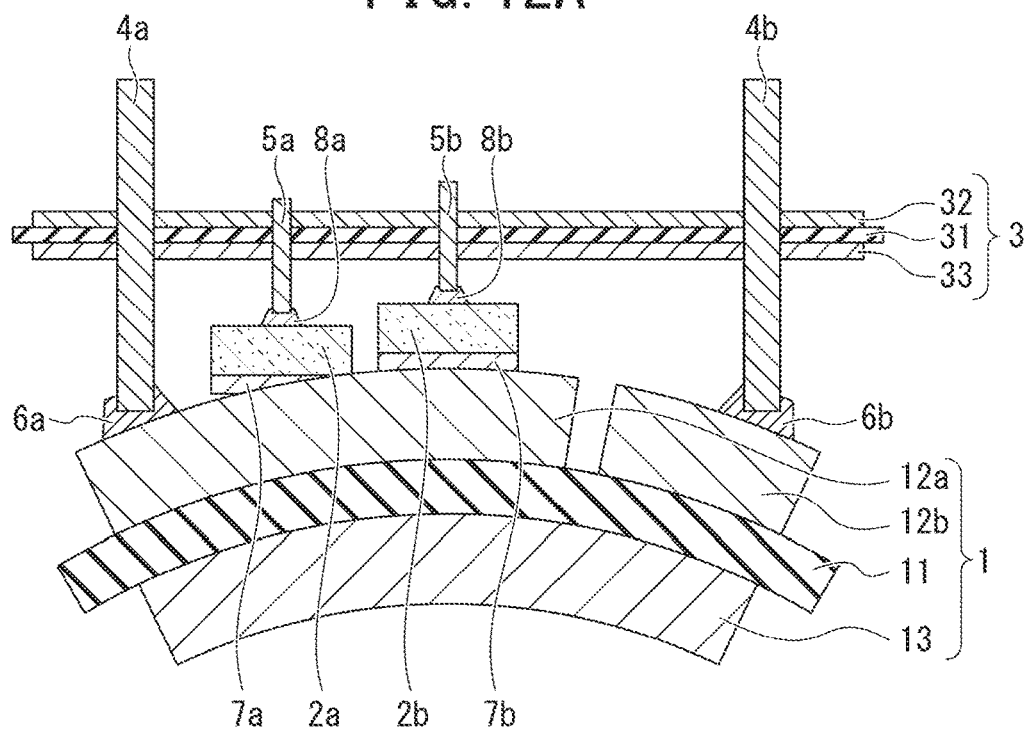
FIG. 12A is a cross-sectional view illustrating a semiconductor device before integral soldering bonding.
Figure 12B:
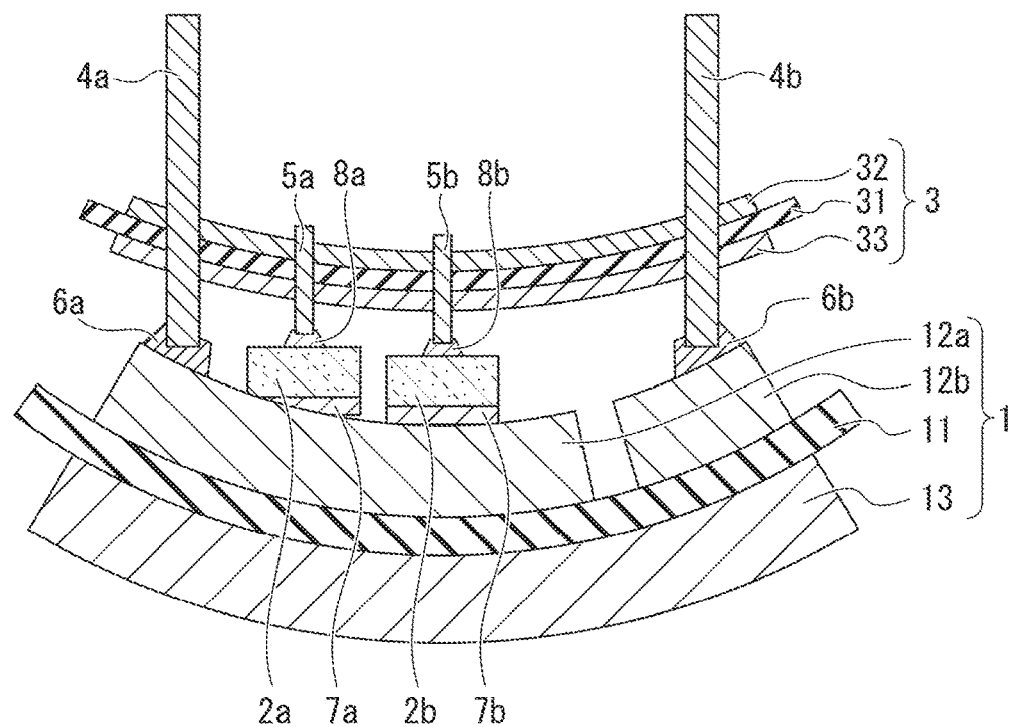
FIG. 12B is a cross-sectional view illustrating the integral soldering bonding of the semiconductor device shown in FIG. 12A.

When a printed circuit board having the same size as that in which the amount of change in warp is 70 micrometers at the temperature between the room temperature and the melting point of solder is mounted on an insulating circuit substrate corresponding to the case "PROVIDED WITH PATTERN" in which the amount of change in the warp is 78 micrometers, the insulating circuit substrate 1 having a warp smaller by 8 micrometers than the printed circuit board 3 at the room temperature is combined with the printed circuit board 3, as illustrated in FIG. 12A. FIG. 12A schematically illustrates the insulating circuit substrate 1 having the warp of −8 micrometers at the room temperature and the printed circuit board 3 having the warp of zero micrometers at the room temperature. In this case, as illustrated in FIG. 12B, the insulating circuit substrate 1 and the printed circuit board 3 both have the warp of 70 micrometers at the melting point of solder so as to have the same warped amount. The controller 102 predicts the warped amount and the warped direction of each of the insulating circuit substrate 1 and the printed circuit board 3 at the melting point of solder illustrated in FIG. 11B and FIG. 11B.

<Method of Manufacturing Semiconductor Device>

Next, a method of manufacturing the semiconductor device according to the first embodiment is described below with reference to the flowchart shown in FIG. 13. The following explanations are made while referring to the reference numerals illustrated in FIG. 1.

In step S100, the plural insulating circuit substrates 1 are prepared. In step S101, the measurement unit 101 measures the initial configuration of the respective insulating circuit substrates 1. The respective insulating circuit substrates 1 when the initial configuration is measured may be either warped or flat.

In step S102, the controller 102 predicts the amount of deformation of the respective insulating circuit substrates 1 when heated during the soldering step in accordance with the measurement results of the initial configuration of the respective insulating circuit substrates 1 obtained by the measurement unit 101. The controller 102 determines whether the warped amount of the respective insulating circuit substrates 1 predicted is within the allowable range. When the warped amount is determined to be outside the allowable range, the process proceeds to step S103, and the corresponding insulating circuit substrates 1 determined to be outside the allowable range are rejected as an inferior product.

When the warped amount is determined to be within the allowable range in step S102, the process proceeds to step S104. In step S104, the controller 102 determines whether the warp of the respective insulating circuit substrates 1 when heated is the positive warp or the negative warp. The assembly unit 104 sorts the respective insulating circuit substrates 1 into the insulating circuit substrates 1 determined to be warped in the positive direction when heated, and the insulating circuit substrates 1 determined to be warped in the negative direction when heated, in accordance with the determination results obtained by the controller 102.

In step S105, the bonding members 6*a*, 6*b*, 7*a* and 7*b* such as solders are applied to the top surface of the corresponding insulating circuit substrate 1 determined to be warped in the positive direction when heated. In step S106, the semiconductor chips 2*a* and 2*b* are mounted on the top surface of the insulating circuit substrate 1 via the bonding members 7*a* and 7*b*. The external terminals 4*a* and 4*b* are also mounted on the top surface of the insulating circuit substrate 1 via the bonding members 6*a* and 6*b*. The external terminals 4*a* and 4*b* may be inserted and bonded to the printed circuit board 3 in the same manner as the pins 5*a* and 5*b*, instead of being mounted at this point. In step S107, the bonding members 8*a* and 8*b* such as solders are applied to the top surfaces of the semiconductor chips 2*a* and 2*b*.

In step S108, the bonding members 6*a*, 6*b*, 7*a* and 7*b* such as solders are applied to the top surface of the corresponding insulating circuit substrate 1 determined to be warped in the negative direction when heated. In step S109, the semiconductor chips 2*a* and 2*b* are mounted on the top surface of the insulating circuit substrate 1 via the bonding members 7*a* and 7*b*. The external terminals 4*a* and 4*b* are also mounted on the top surface of the insulating circuit substrate 1 via the bonding members 6*a* and 6*b*. In step S110, the bonding members 8*a* and 8*b* such as solders are applied to the top surfaces of the semiconductor chips 2*a* and 2*b*.

In step S111, the plural printed circuit boards 3 each including the insulating layer 31, the first wiring layer 32, and the second wiring layer 33 are prepared. The respective printed circuit boards 3 are integrated with the pins 5*a* and 5*b* inserted to the penetration holes of the respective printed circuit boards 3 with a pressure applied to the main surface in the vertical direction.

In step S112, the measurement unit 101 measures the initial configuration of the respective printed circuit boards 3. The respective printed circuit boards 3 when the initial configuration is measured may be either warped or flat.

In step S113, the controller 102 predicts the amount of deformation of the respective printed circuit boards 3 when heated during the soldering step in accordance with the measurement results of the initial configuration of the respective printed circuit boards 3 obtained by the measurement unit 101. The controller 102 determines whether the warped amount of the respective printed circuit boards 3 predicted is within the allowable range. When the warped amount is determined to be outside the allowable range, the process proceeds to step S114, and the corresponding printed circuit boards 3 determined to be outside the allowable range are rejected as an inferior product.

When the warped amount is determined to be within the allowable range in step S113, the process proceeds to step S115. In step S115, the controller 102 determines whether the warp of the respective printed circuit boards 3 when heated is the positive warp or the negative warp. The assembly unit 104 sorts the respective printed circuit boards 3 into the printed circuit boards 3 determined to be warped in the positive direction when heated, and the printed circuit boards 3 determined to be warped in the negative direction when heated, in accordance with the determination results obtained by the controller 102.

In step S116, the combination of the insulating circuit substrate 1 and the printed circuit board 3 each determined to be warped in the positive direction when heated is chosen, so that the printed circuit board 3 is opposed to the top surface of the insulating circuit substrate 1 by use of a jig such as a carbon to lead the pins 5a and 5b inserted to the printed circuit board 3 to be mounted on the top surface of the insulating circuit substrate 1 via the bonding members 8a and 8b. The external terminals 4a and 4b are inserted to the penetration holes of the printed circuit board 3.

In step S117, the combination of the insulating circuit substrate 1 and the printed circuit board 3 each determined to be warped in the negative direction when heated is chosen, so that the printed circuit board 3 is opposed to the top surface of the insulating circuit substrate 1 by use of a jig such as a carbon to lead the pins 5a and 5b inserted to the printed circuit board 3 to be mounted on the top surface of the insulating circuit substrate 1 via the bonding members 8a and 8b. The external terminals 4a and 4b are inserted to the penetration holes of the printed circuit board 3.

In step S118, the respective substrates are entirely heated with a heating furnace at a temperature of about 200 degrees or greater and 350 degrees or lower to melt the bonding members 6a, 6b, 7a, 7b, 8a and 8b so as to be integrally bonded together. This heating causes the thermal warp in each of the insulating circuit substrate 1 and the printed circuit board 3, as illustrated in FIG. 1 or FIG. 5. Since the respective warps are complementary to each other between the insulating circuit substrate 1 and the printed circuit board 3 as illustrated with the semiconductor device in FIG. 1 or FIG. 5, the pins 5a and 5b and the semiconductor chips 2a and 2b can be close within a predetermined gap, so as to avoid an open fault between the pins 5a and 5b and the semiconductor chips 2a and 2b.

In this step, either the external terminals 4a and 4b and the pins 5a and 5b or the penetration holes of the printed circuit board 3, or both of them are preliminarily plated with tin (Sn) or subjected to solder plating, so that the respective solders are melted upon the integral bonding to lead the external terminals 4a and 4b and the pins 5a and 5b to be fixed to the penetration holes of the printed circuit board 3. These elements are then molded with resin by use of a metal die (not illustrated), so as to complete the semiconductor device as illustrated in FIG. 1 or FIG. 5.

Figure 14:
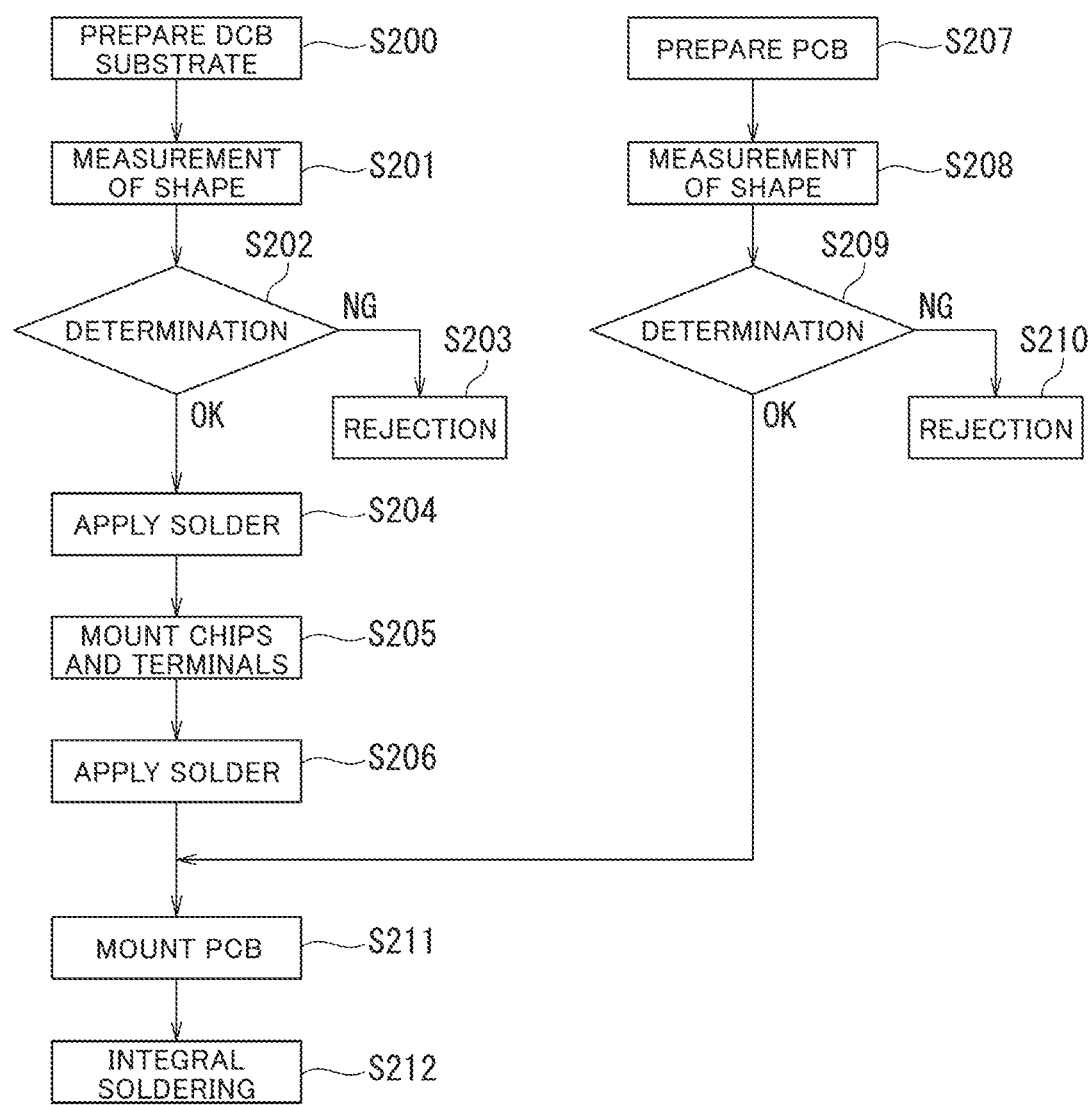
FIG. 14 is a flowchart illustrating a method of manufacturing a semiconductor device of a comparative example.

A method of manufacturing a semiconductor device of a comparative example is described below with reference to the flowchart illustrated in FIG. 14. The process in steps S200 to S203 illustrated in FIG. 14 is substantially the same as the process in steps S100 to S103 illustrated in FIG. 13, while the method illustrated in FIG. 14 does not include a step of determining the warped direction of the insulating circuit substrate 1 corresponding to the step S104 illustrated in FIG. 13. The process in steps S204 to S206 illustrated in FIG. 14 is substantially the same as the process in steps S105 to S107 or in steps S108 to S110 illustrated in FIG. 13. The process in steps S207 to S210 illustrated in FIG. 14 is substantially the same as the process in steps S111 to S114 illustrated in FIG. 13, while the method illustrated in FIG. 14 does not include a step of determining the warped direction of the printed circuit board 3 corresponding to the step S115 illustrated in FIG. 13. While the process in step S211 illustrated in FIG. 14 is similar to the process in step S116 or S117 illustrated in FIG. 13, the printed circuit board 3 and the insulating circuit substrate 1 are combined to be bonded together regardless of the warped direction of each of the printed circuit board 3 and the insulating circuit substrate 1.

The method of manufacturing the semiconductor device of the comparative example in step S211 selects the printed circuit board 3 and the insulating circuit substrate 1 which are flat as much as possible such that the standard of the warped amount is strictly limited (for example, the standard R1 illustrated in FIG. 8) in step S202 or S209 so as not to cause an open fault if the printed circuit board 3 and the insulating circuit substrate 1 warped in the opposite directions are combined. This leads to a reduction in the rate of good-quality products of the printed circuit board 3 and the insulating circuit substrate 1, and thus reduces the yield rate accordingly.

In contrast, the method of manufacturing the semiconductor device according to the first embodiment combines the printed circuit board 3 and the insulating circuit substrate 1, when both warped, in which the respective warps are complementary to each other (the warped directions conform to each other) in step S116 and S117 illustrated in FIG. 13. The method thus can use the relaxed standard set for the warped amount upon the determination in step S102 and S113 (for example, the standard R2 illustrated in FIG. 8), so as to increase the yield rate. The combination of the printed circuit board 3 and the insulating circuit substrate 1 having the warps complementary to each other (warped in the same direction) can fabricate the semiconductor device with an open fault avoided.

In step S102 in FIG. 13, the warped amount of the insulating circuit substrate 1 may be determined in a stepwise manner by use of both the allowable range R1 and the allowable range R2. For example, when the insulating circuit substrate 1 is determined to be within the first allowable range R1 upon the determination in step S102, the corresponding insulating circuit substrate 1 is combined with the printed circuit board 3 regardless of the warped direction of the insulating circuit substrate 1 (even though the warped direction does not conform to that of the printed circuit board 3). The insulating circuit substrate 1, when determined not to be within the first allowable range R1, is then determined whether to be within the second allowable range R2. The insulating circuit substrate 1, when determined to be within the second allowable range R2, is combined with the printed circuit board 3 having the same warped direction. The insulating circuit substrate 1, when determined not to be within the second allowable range R2, is then rejected. This increases the flexibility of combination between the insulating circuit substrate 1 and the printed circuit board 3 which can avoid an occurrence of an open fault.

Second Embodiment

<Semiconductor Device>

Figure 15:
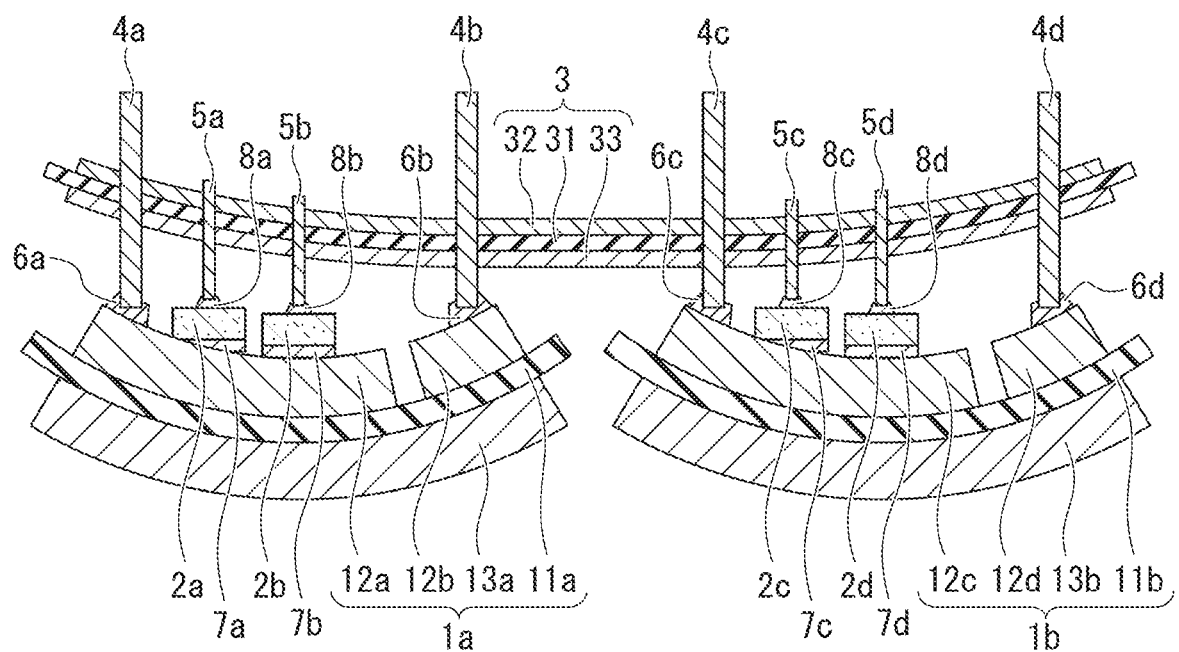
FIG. 15 is a cross-sectional view illustrating a semiconductor device according to a second embodiment.

A semiconductor device according to the second embodiment includes a first insulating circuit substrate 1a and a second insulating circuit substrate 1b, and a printed circuit board 3 arranged to be opposed to the respective top surfaces of the first insulating circuit substrate 1a and the second insulating circuit substrate 1b, as illustrated in FIG. 15. Although not illustrated in FIG. 15, a sealing member may be provided to seal the circumference of the first insulating circuit substrate 1a, the second insulating circuit substrate 1b, and the printed circuit board 3.

The first insulating circuit substrate 1a and the second insulating circuit substrate 1b each have a configuration similar to the insulating circuit substrate 1 illustrated in FIG. 1, and may be a DCB substrate or an AMB substrate, for example. The first insulating circuit substrate 1a on the left side in FIG. 15 includes a first insulating substrate 11a, first upper conductive layers 12a and 12b arranged on the top surface of the first insulating substrate 11a, and a first lower conductive layer 13a arranged on the bottom surface of the first insulating substrate 11a. The second insulating circuit substrate 1b on the right side in FIG. 15 includes a second insulating substrate 11b, second upper conductive layers 12c and 12d arranged on the top surface of the second insulating substrate 11b, and a second lower conductive layer 13b arranged on the bottom surface of the second insulating substrate 11b.

First semiconductor elements (semiconductor chips) 2a and 2b are arranged on the first upper conductive layer 12a via bonding members 7a and 7b such as solders. Second semiconductor elements (semiconductor chips) 2c and 2d are arranged on the second upper conductive layer 12c via bonding members 7c and 7d such as solders.

The printed circuit board 3 includes an insulating layer 31, a first wiring layer 32 deposited on the top surface of the insulating layer 31, and a second wiring layer 33 deposited on the bottom surface of the insulating layer 31. The printed circuit board 3 has a plurality of penetration holes penetrating the insulating layer 31, the first wiring layer 32, and the second wiring layer 33. First external terminals 4a and 4b and second external terminals 4c and 4d are inserted and bonded to the penetration holes of the printed circuit board 3. One end of the first external terminal 4a is bonded to the top surface of the first upper conductive layer 12a via a bonding member 6a such as a solder. One end of the first external terminal 4b is bonded to the top surface of the first upper conductive layer 12b via a bonding member 6b such as a solder. One end of the second external terminal 4c is bonded to the top surface of the second upper conductive layer 12c via a bonding member 6c such as a solder. One end of the second external terminal 4d is bonded to the top surface of the second upper conductive layer 12d via a bonding member 6d such as a solder.

First pins (conductive posts) 5a and 5b and second pins (conductive posts) 5c and 5d are inserted and bonded to the penetration holes of the printed circuit board 3. One end of the first pin 5a is bonded to the top surface of the semiconductor chip 2a via a bonding member 8a such as a solder. One end of the first pin 5b is bonded to the top surface of the semiconductor chip 2b via a bonding member 8b such as a solder. One end of the second pin 5c is bonded to the top surface of the semiconductor chip 2c via a bonding member 8c such as a solder. One end of the second pin 5d is bonded to the top surface of the semiconductor chip 2d via a bonding member 8d such as a solder.

Figure 16:
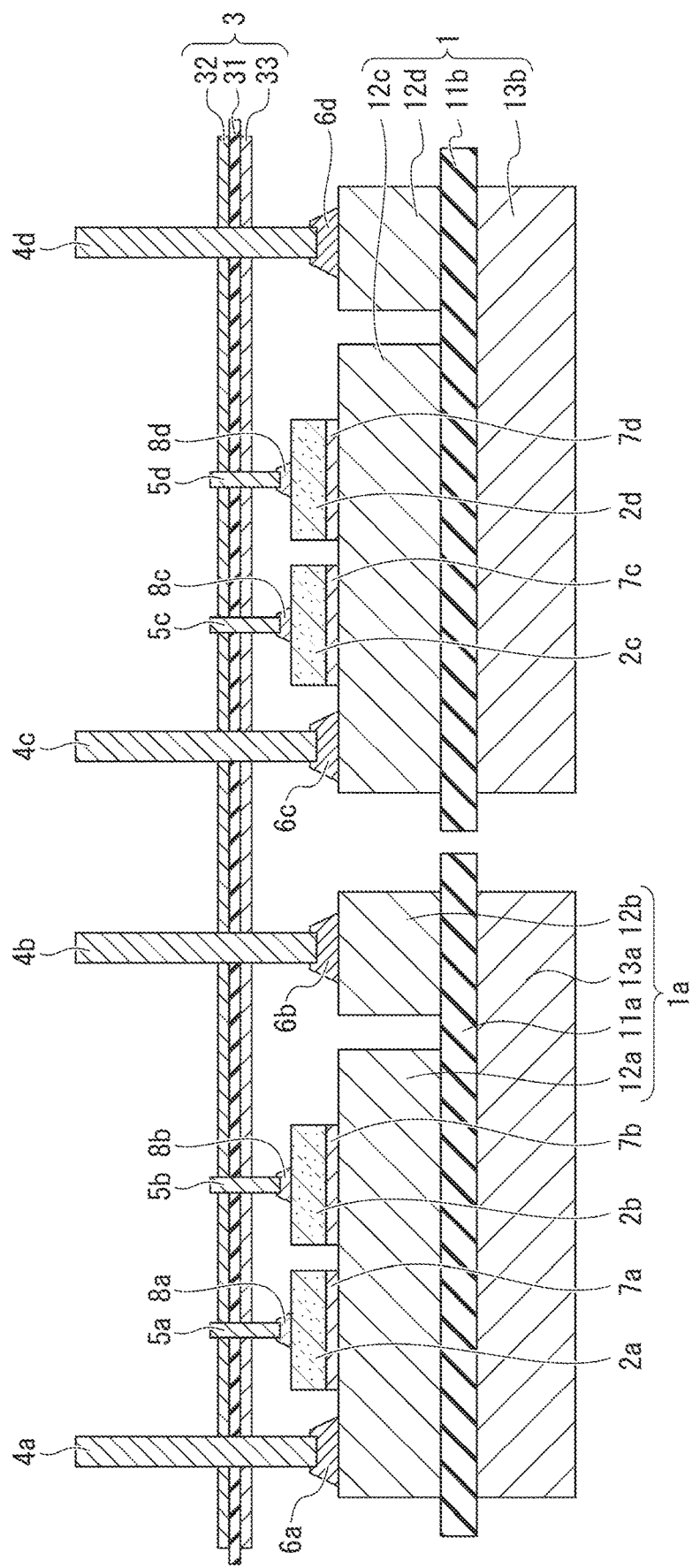
FIG. 16 is a cross-sectional view illustrating a semiconductor device of a comparative example.
Figure 17:
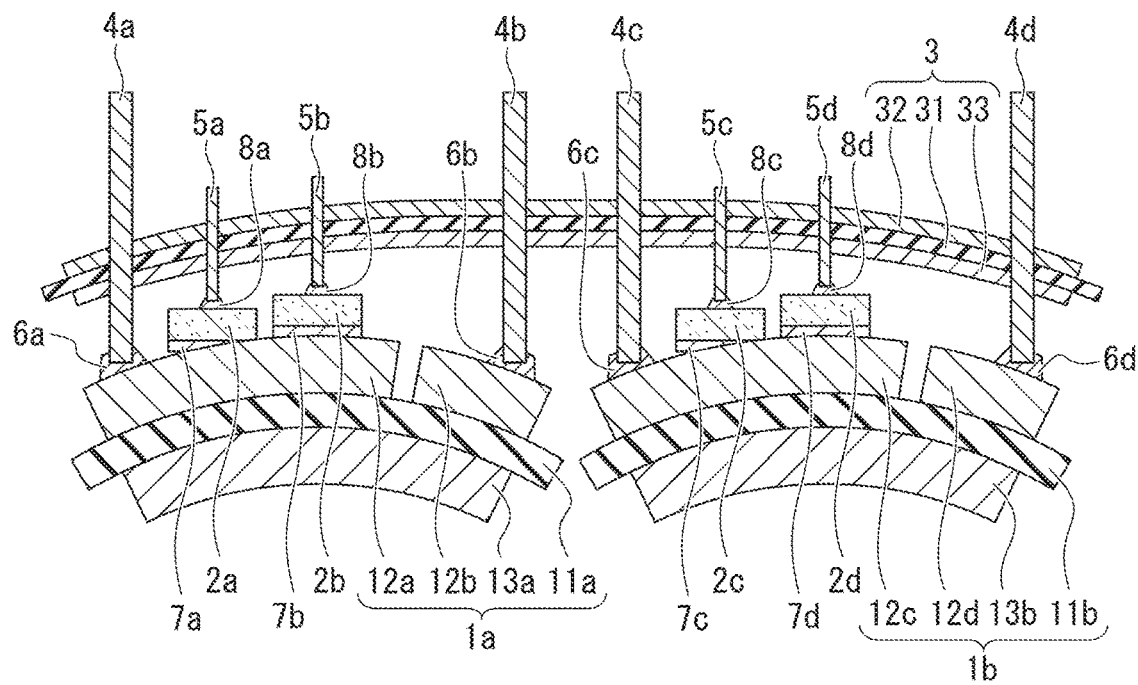
FIG. 17 is a cross-sectional view illustrating a semiconductor device according to a modified example of the second embodiment.

FIG. 16 illustrates a semiconductor device of a comparative example, showing a structure in which the first insulating circuit substrate 1a, the second insulating circuit substrate 1b, and the printed circuit board 3 are all flat. The first insulating circuit substrate 1a, the second insulating circuit substrate 1b, and the printed circuit board 3, which preferably have a flat structure, may be actually warped due to thermal deformation or an external stress caused during assembling steps in the manufacturing process of the semiconductor device.

The semiconductor device according to the second embodiment has a configuration in which each of the first insulating circuit substrate 1a and the second insulating circuit substrate 1b and the printed circuit board 3 have warps complementary to each other, as illustrated in FIG. 15. The first insulating circuit substrate 1a and the second insulating circuit substrate 1b both have a positive warp, and the printed circuit board 3 has a positive warp. This enables each of the first insulating circuit substrate 1a and the second insulating circuit substrate 1b and the printed circuit board 3 to come close to each other within a predetermined gap, and can avoid an open fault between the first and second pins 5a to 5d and the semiconductor chips 2a to 2d, so as to ensure the electrical conductivity.

The semiconductor devices according to some modified examples of the second embodiment are described below with reference to FIG. 17 to FIG. 20. The semiconductor device according to one modified example of the second embodiment illustrated in FIG. 17 has a configuration in which the first insulating circuit substrate 1a and the second insulating circuit substrate 1b each have a negative warp, and the printed circuit board 3 has a negative warp. This modified example is included in the case in which each of the first insulating circuit substrate 1a and the second insulating circuit substrate 1b and the printed circuit board 3 have the warps which are complementary to each other.

Figure 18:
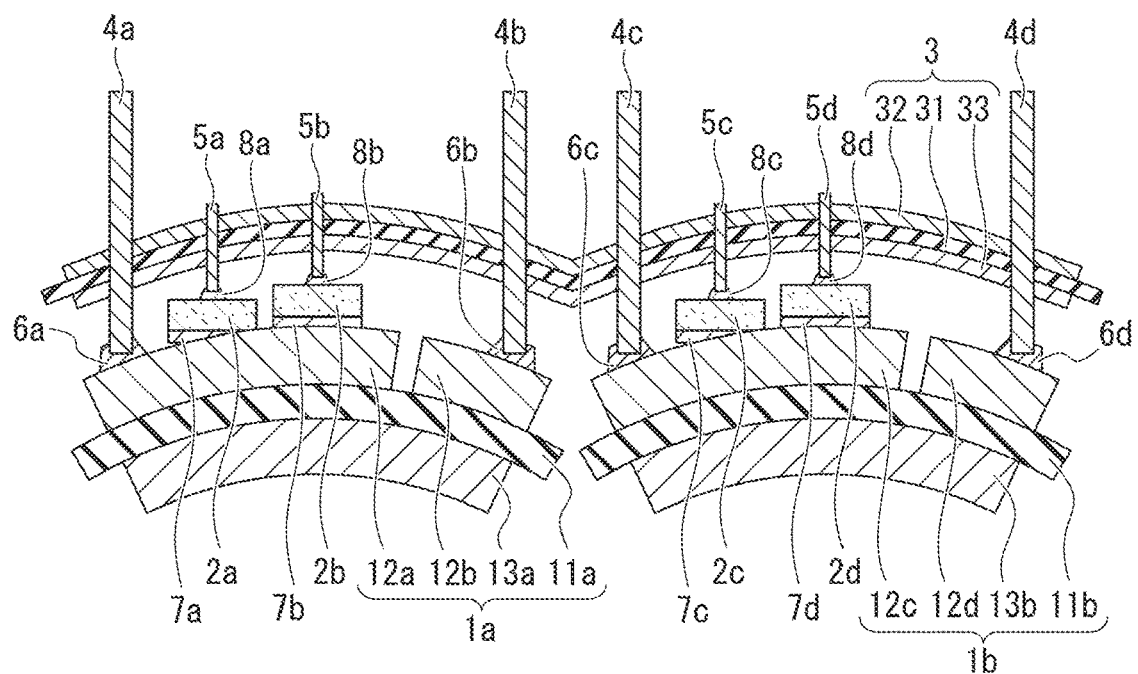
FIG. 18 is a cross-sectional view illustrating a semiconductor device according to a modified example of the second embodiment.

The semiconductor device according to another modified example of the second embodiment illustrated in FIG. 18 has a configuration in which the first insulating circuit substrate 1a and the second insulating circuit substrate 1b each have a negative warp, and the printed circuit board 3 has an M-shaped warp. A part of the printed circuit board 3 opposed to the first insulating circuit substrate 1a has a negative warp, and a part of the printed circuit board 3 opposed to the second insulating circuit substrate 1b has a negative warp. For example, the warp of the printed circuit board 3 sometimes partly varies because the first wiring layer 32 and the second wiring layer 33 each have a circuit pattern which is divided by the region opposed to the first insulating circuit substrate 1 and the region opposed to the second insulating circuit substrate 1b. This modified example is also included in the case in which each of the first insulating circuit substrate 1a and the second insulating circuit substrate 1b and the printed circuit board 3 have the warps which are complementary to each other.

Figure 19:
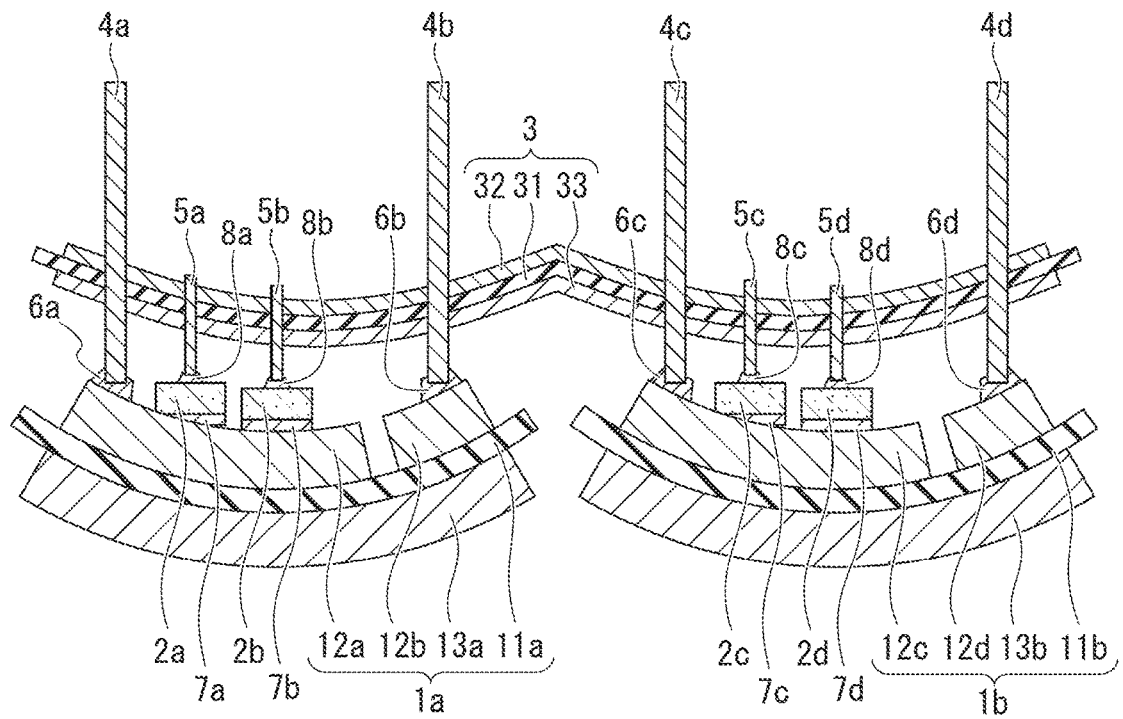
FIG. 19 is a cross-sectional view illustrating a semiconductor device according to a modified example of the second embodiment.

The semiconductor device according to still another modified example of the second embodiment illustrated in FIG. 19 has a configuration in which the first insulating circuit substrate 1a and the second insulating circuit substrate 1b each have a positive warp, and the printed circuit board 3 has a W-shaped warp. A part of the printed circuit board 3 opposed to the first insulating circuit substrate 1a has a positive warp, and a part of the printed circuit board 3 opposed to the second insulating circuit substrate 1b has a positive warp. This modified example is also included in the case in which each of the first insulating circuit substrate 1a and the second insulating circuit substrate 1b and the printed circuit board 3 have the warps which are complementary to each other.

Figure 20:
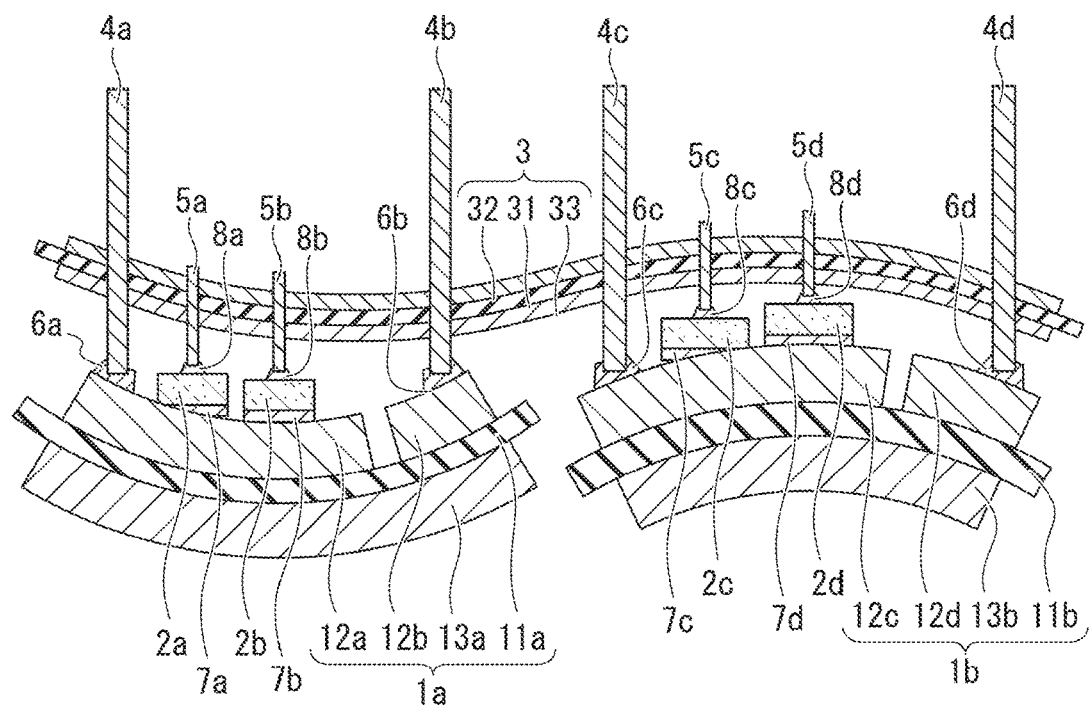
FIG. 20 is a cross-sectional view illustrating a semiconductor device according to a modified example of the second embodiment.

The semiconductor device according to still another modified example of the second embodiment illustrated in FIG. 20 has a configuration in which the first insulating circuit substrate 1a has a positive warp, the second insulating circuit substrate 1b has a negative warp, and the printed circuit board 3 has a waved shape (an N-shaped warp). A part of the printed circuit board 3 opposed to the first insulating circuit substrate 1a has a positive warp, and a part of the printed circuit board 3 opposed to the second insulating circuit substrate 1b has a negative warp. This modified example is also included in the case in which each of the first insulating circuit substrate 1a and the second insulating circuit substrate 1b and the printed circuit board 3 have the warps which are complementary to each other.

Figure 21:
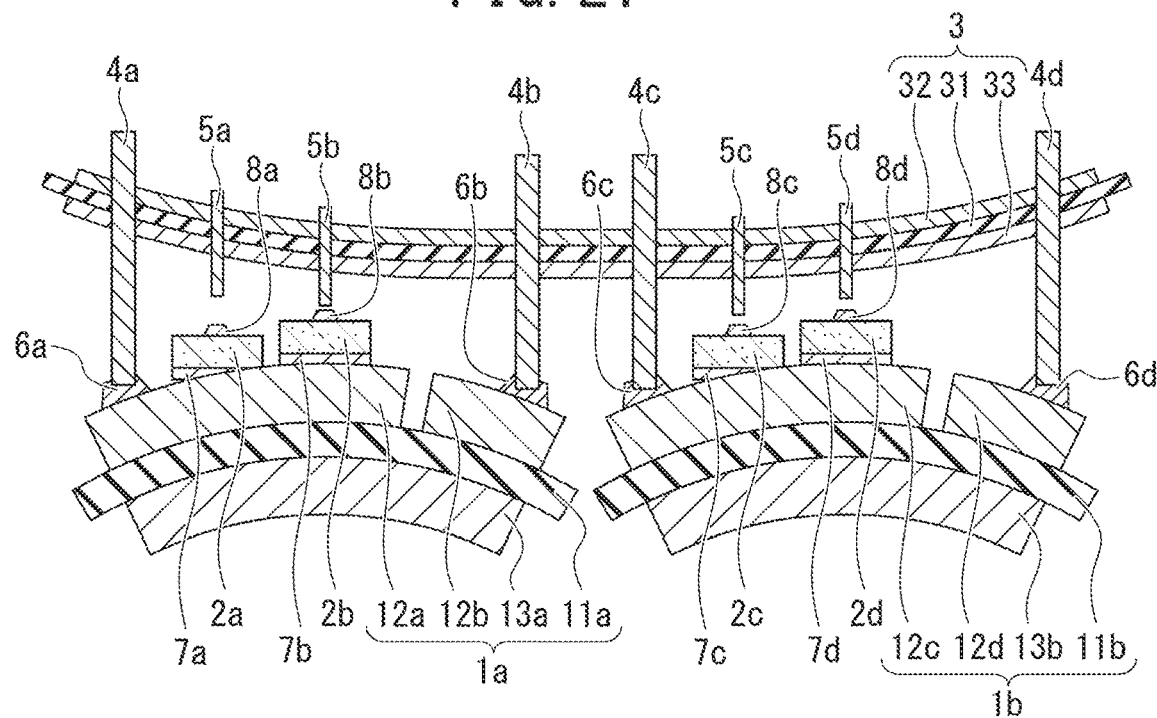
FIG. 21 is a cross-sectional view illustrating a semiconductor device of a comparative example.

Semiconductor devices of some comparative examples are described below with reference to FIG. 21 and FIG. 27. A semiconductor device of a comparative example illustrated in FIG. 21 differs from the semiconductor device according to the second embodiment illustrated in FIG. 15 in the configuration in which the first insulating circuit substrate 1a and the second insulating circuit substrate 1b both have a negative warp, while the printed circuit board 3 has a positive warp. The semiconductor device of this comparative example illustrated in FIG. 21 has the configuration in which the printed circuit board 3 is distant from the first insulating circuit substrate 1a and the second insulating circuit substrate 1b on the circumference side, which causes an open fault between the first pin 5a and the semiconductor chip 2a and an open fault between the second pin 5d and the semiconductor chip 2d each being located on the circumferential side.

Figure 22:
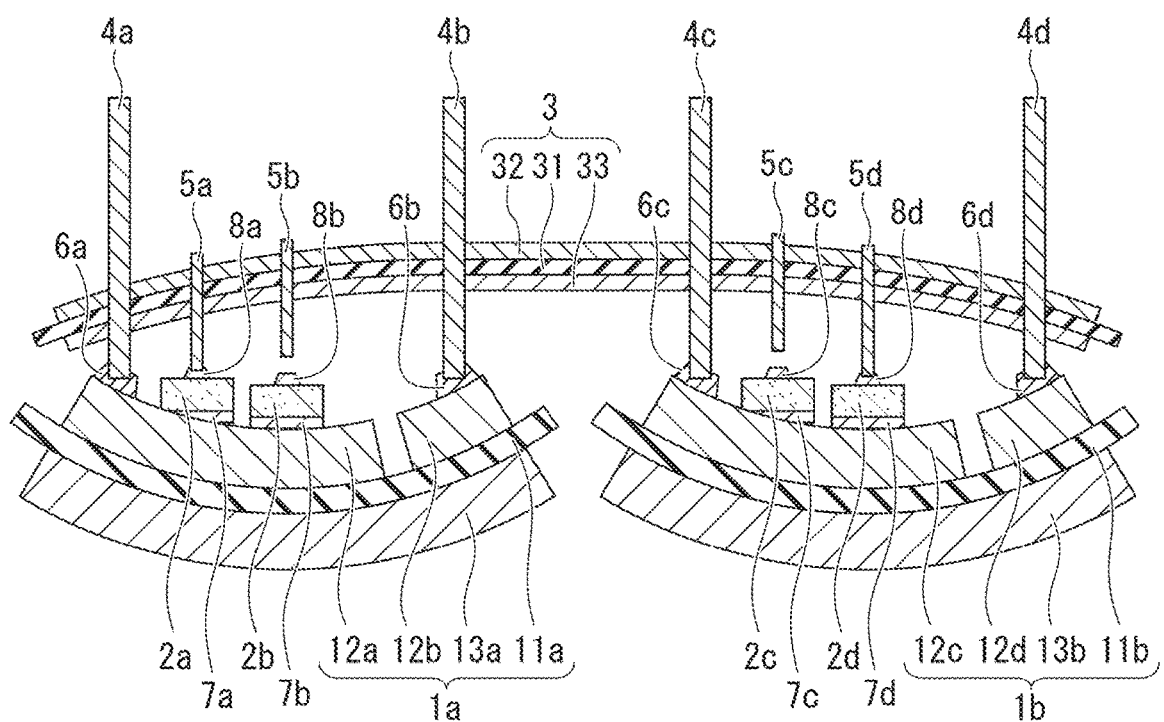
FIG. 22 is a cross-sectional view illustrating a semiconductor device of a comparative example.

A semiconductor device of another comparative example illustrated in FIG. 22 differs from the semiconductor device according to the second embodiment illustrated in FIG. 15 in the configuration in which the first insulating circuit substrate 1a and the second insulating circuit substrate 1b both have a positive warp, while the printed circuit board 3 has a negative warp. The semiconductor device of this comparative example illustrated in FIG. 22 has the configuration in which the printed circuit board 3 is distant from the first insulating circuit substrate 1a and the second insulating circuit substrate 1b on the central side, which causes an open fault between the first pin 5b and the semiconductor chip 2b and an open fault between the second pin 5c and the semiconductor chip 2c each being located on the central side.

Figure 23:
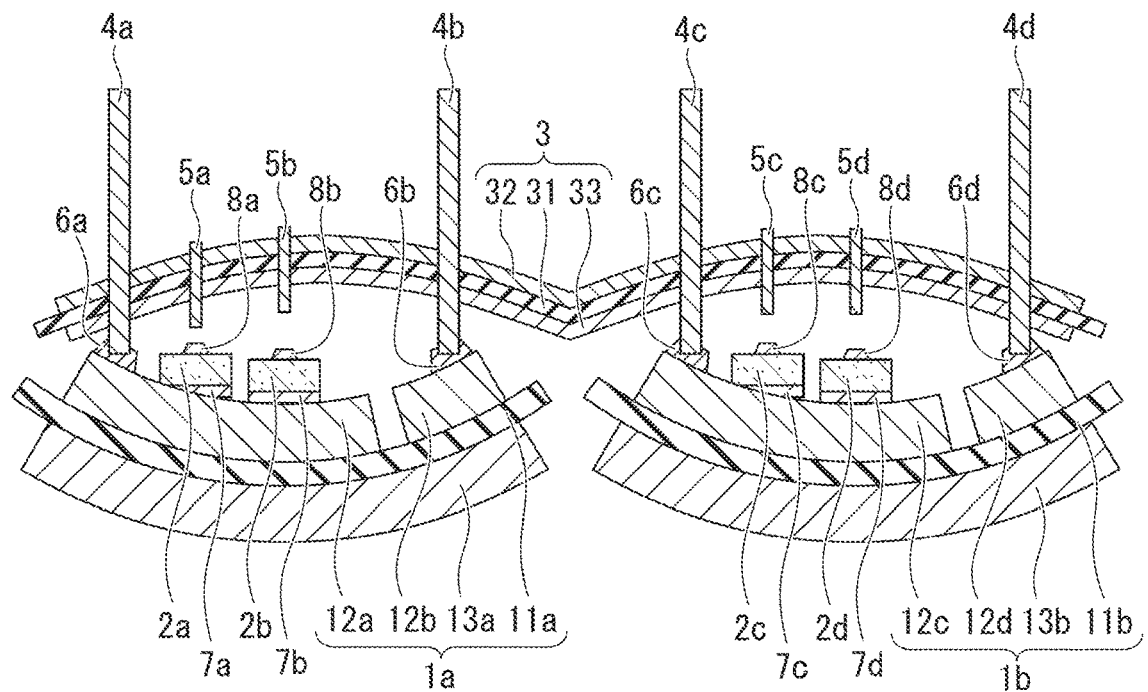
FIG. 23 is a cross-sectional view illustrating a semiconductor device of a comparative example.

A semiconductor device of still another comparative example illustrated in FIG. 23 differs from the semiconductor device according to the second embodiment illustrated in FIG. 15 in the configuration in which the first insulating circuit substrate 1a and the second insulating circuit substrate 1b both have a positive warp, while the printed circuit board 3 has an M-shaped warp. A part of the printed circuit board 3 opposed to the first insulating circuit substrate 1a has a negative warp, and the region of the printed circuit board 3 opposed to the first insulating circuit substrate 1a on the central side is thus distant from the first insulating circuit substrate 1a, which causes an open fault between the first pins 5a and 5b and the semiconductor chips 2a and 2b located on the central side. A part of the printed circuit board 3 opposed to the second insulating circuit substrate 1b has a negative warp, and the region of the printed circuit board 3 opposed to the second insulating circuit substrate 1b on the central side is thus distant from the second insulating circuit substrate 1b, which causes an open fault between the second pins 5c and 5d and the semiconductor chips 2c and 2d located on the central side.

Figure 24:
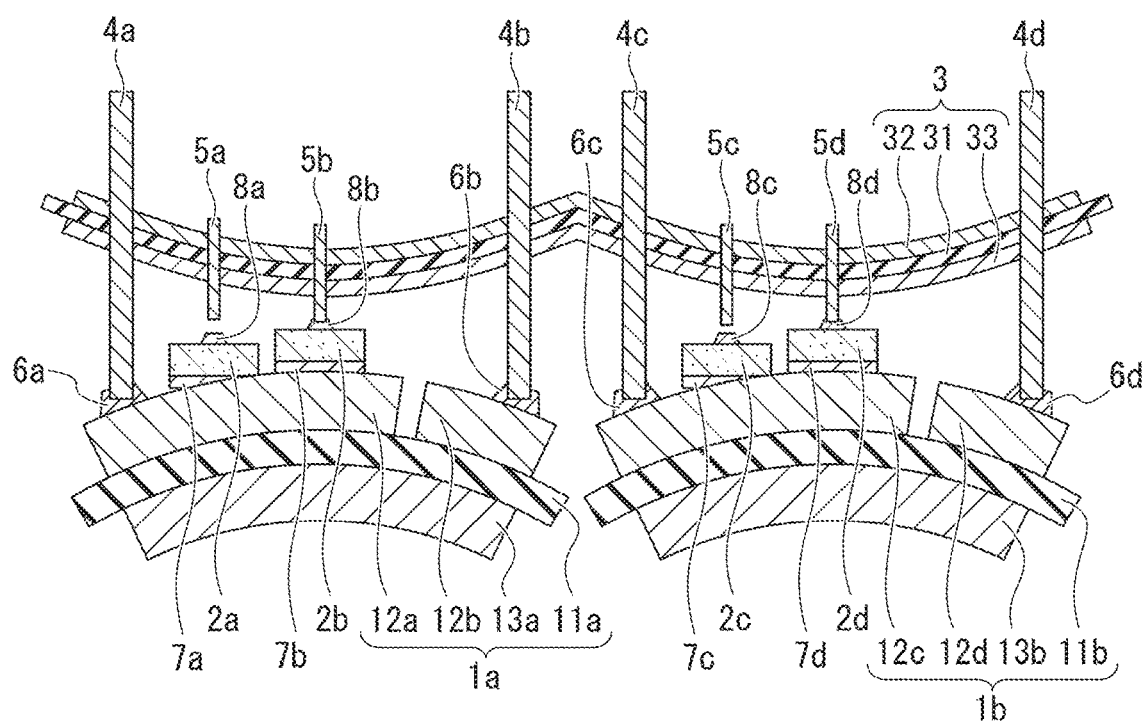
FIG. 24 is a cross-sectional view illustrating a semiconductor device of a comparative example.

A semiconductor device of still another comparative example illustrated in FIG. 24 differs from the semiconductor device according to the second embodiment illustrated in FIG. 15 in the configuration in which the first insulating circuit substrate 1a and the second insulating circuit substrate 1b both have a negative warp, while the printed circuit board 3 has a W-shaped warp. A part of the printed circuit board 3 opposed to the first insulating circuit substrate 1a has a positive warp, and the region of the printed circuit board 3 opposed to the first insulating circuit substrate 1a on the circumferential side is thus distant from the first insulating circuit substrate 1a, which causes an open fault between the first pin 5a and the semiconductor chip 2a located on the circumferential side. A part of the printed circuit board 3 opposed to the second insulating circuit substrate 1b has a positive warp, and the region of the printed circuit board 3 opposed to the second insulating circuit substrate 1b on the circumferential side is thus distant from the second insulating circuit substrate 1b, which causes an open fault between the second pin 5c and the semiconductor chip 2c located on the circumferential side.

Figure 25:
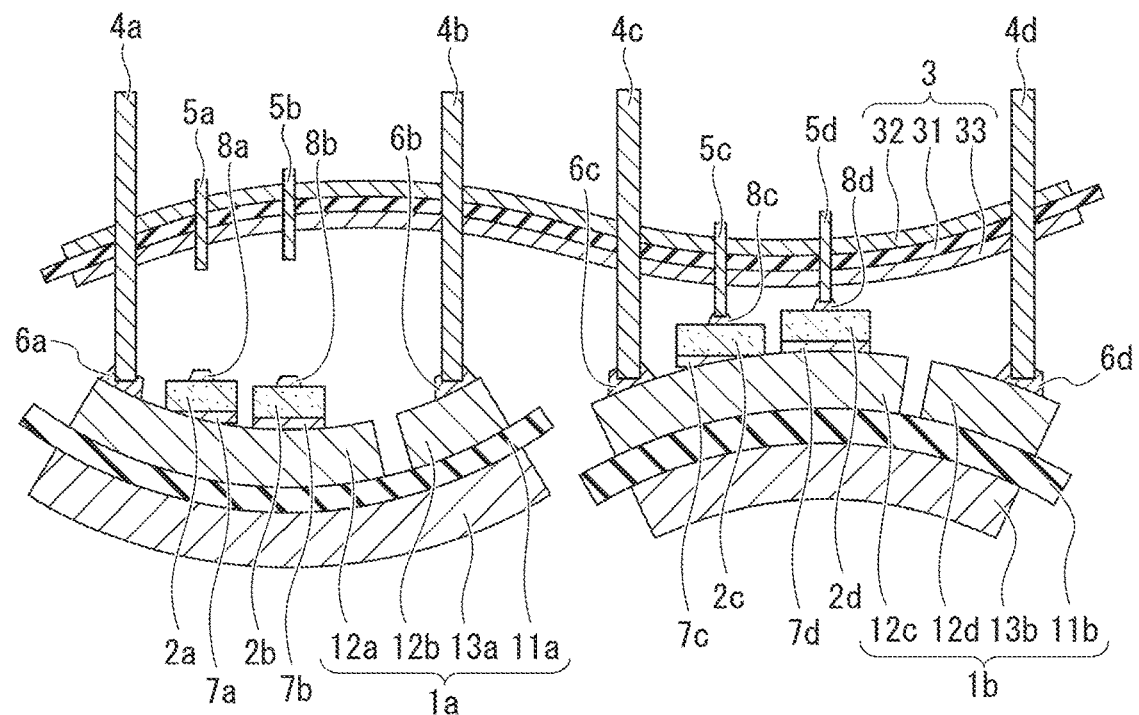
FIG. 25 is a cross-sectional view illustrating a semiconductor device of a comparative example.

A semiconductor device of still another comparative example illustrated in FIG. 25 differs from the semiconductor device according to the second embodiment illustrated in FIG. 15 in the configuration in which the first insulating circuit substrate 1a has a positive warp, the second insulating circuit substrate 1b has a negative warp, and the printed circuit board 3 has a waved shape (an N-shaped warp). A part of the printed circuit board 3 opposed to the first insulating circuit substrate 1a has a negative warp, and the region of the printed circuit board 3 opposed to the first insulating circuit substrate 1a on the central side is thus distant from the first insulating circuit substrate 1a, which causes an open fault between the first pins 5a and 5b and the semiconductor chips 2a and 2b. A part of the printed circuit board 3 opposed to the second insulating circuit substrate 1b has a positive warp, and the region of the printed circuit board 3 opposed to the second insulating circuit substrate 1b on the circumferential side is thus distant from the second insulating circuit substrate 1b.

Figure 26:
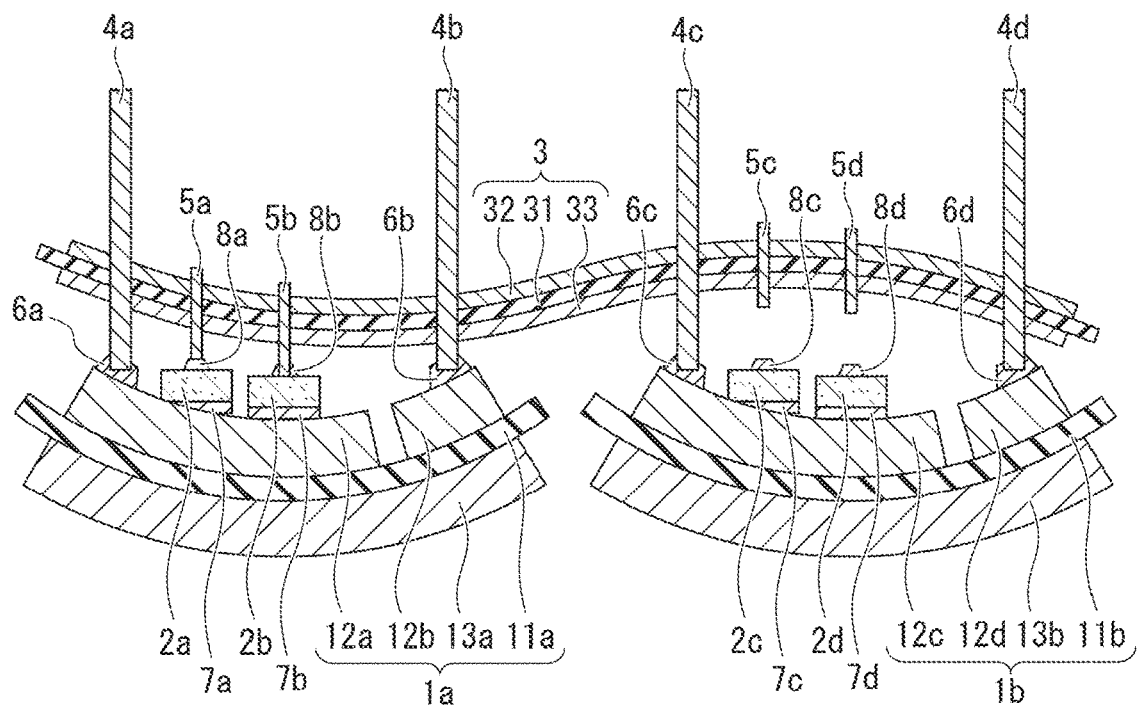
FIG. 26 is a cross-sectional view illustrating a semiconductor device of a comparative example.

A semiconductor device of still another comparative example illustrated in FIG. 26 differs from the semiconductor device according to the second embodiment illustrated in FIG. 15 in the configuration in which the first insulating circuit substrate 1a and the second insulating circuit substrate 1b both have a positive warp, and the printed circuit board 3 has a waved shape (an N-shaped warp). A part of the printed circuit board 3 opposed to the first insulating circuit substrate 1a has a positive warp, so that the region of the printed circuit board 3 opposed to the first insulating circuit substrate 1a has the warp complementary to the warp of the first insulating circuit substrate 1a. However, a part of the printed circuit board 3 opposed to the second insulating circuit substrate 1b has a negative warp, and the region of the printed circuit board 3 opposed to the second insulating circuit substrate 1b on the central side is thus distant from the second insulating circuit substrate 1b, which causes an open fault between the second pins 5c and 5d and the semiconductor chips 2c and 2d located on the central side.

Figure 27:
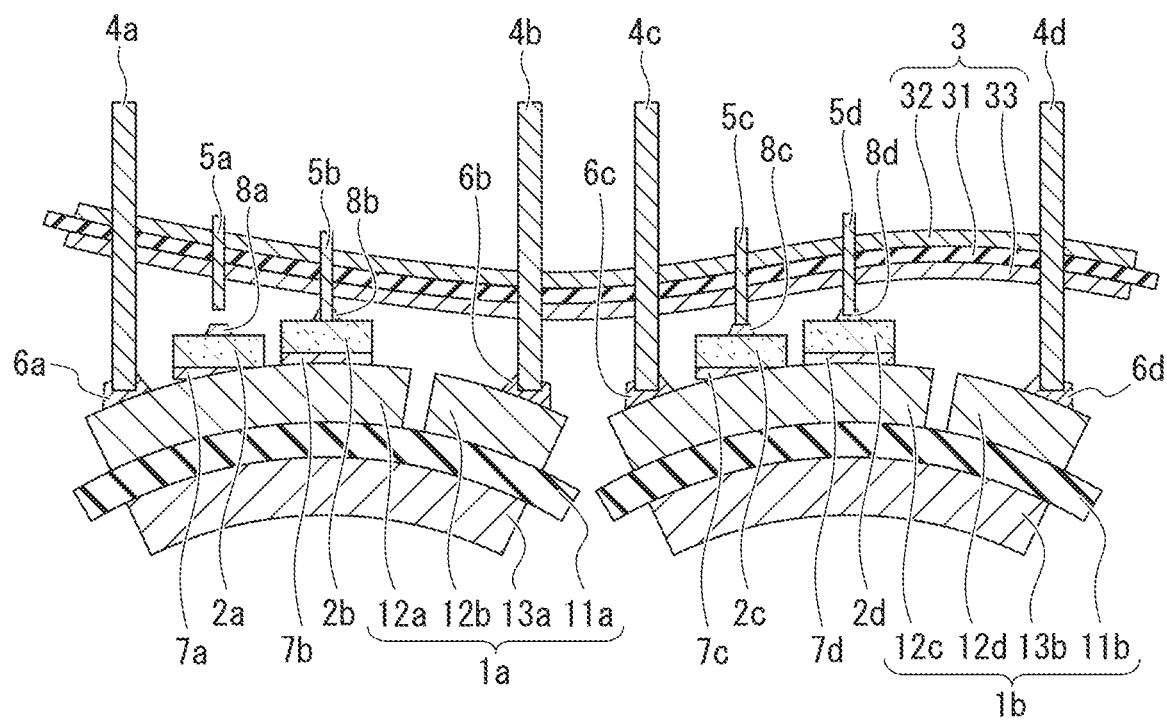
FIG. 27 is a cross-sectional view illustrating a semiconductor device of a comparative example.

A semiconductor device of still another comparative example illustrated in FIG. 27 differs from the semiconductor device according to the second embodiment illustrated in FIG. 15 in the configuration in which the first insulating circuit substrate 1a and the second insulating circuit substrate 1b both have a negative warp, and the printed circuit board 3 has a waved shape (an N-shaped warp). A part of the printed circuit board 3 opposed to the first insulating circuit substrate 1a has a positive warp, and the region of the printed circuit board 3 opposed to the first insulating circuit substrate 1a on the circumferential side is thus distant from the first insulating circuit substrate 1a, which causes an open fault between the first pin 5a and the semiconductor chip 2a located on the circumferential side. A part of the printed circuit board 3 opposed to the second insulating circuit substrate 1b has a negative warp, so that the region of the printed circuit board 3 opposed to the second insulating circuit substrate 1b has the warp partly complementary to the warp of the second insulating circuit substrate 1b.

In contrast to the semiconductor devices of the respective comparative examples illustrated in FIG. 21 to FIG. 27, the semiconductor device according to the second embodiment has the configuration in which each of the first insulating circuit substrate 1a and the second insulating circuit substrate 1b and the printed circuit board 3 have the warps are complementary to each other, so as to bring the first pins 5a and 5b and the second pins 5c and 5d and the semiconductor chips 2a to 2d to be close within a predetermined gap, as illustrated in FIG. 15 and FIG. 17 to FIG. 20. The configuration thus can avoid an open fault between the first and second pins 5a to 5d and the semiconductor chips 2a to 2d, so as to ensure the electrical conductivity.

Figure 29:
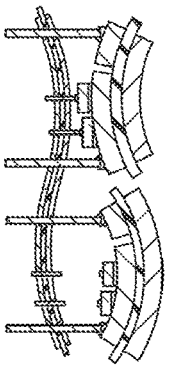
FIG. 29 is a table illustrating a relationship of warps between the printed circuit board and the insulating circuit substrates.

FIG. 28 and FIG. 29 each illustrate a table showing a relationship between the warp of each of the first insulating circuit substrate 1a and the second insulating circuit substrate 1b (indicated by "DCB" in FIG. 28 and FIG. 29) and the warp of the printed circuit board 3 (indicated by "PCB" in FIG. 28 and FIG. 29), corresponding to the respective structures illustrated in FIG. 15 and FIG. 17 to FIG. 27.

<Method of Manufacturing Semiconductor Device>

Figure 30:
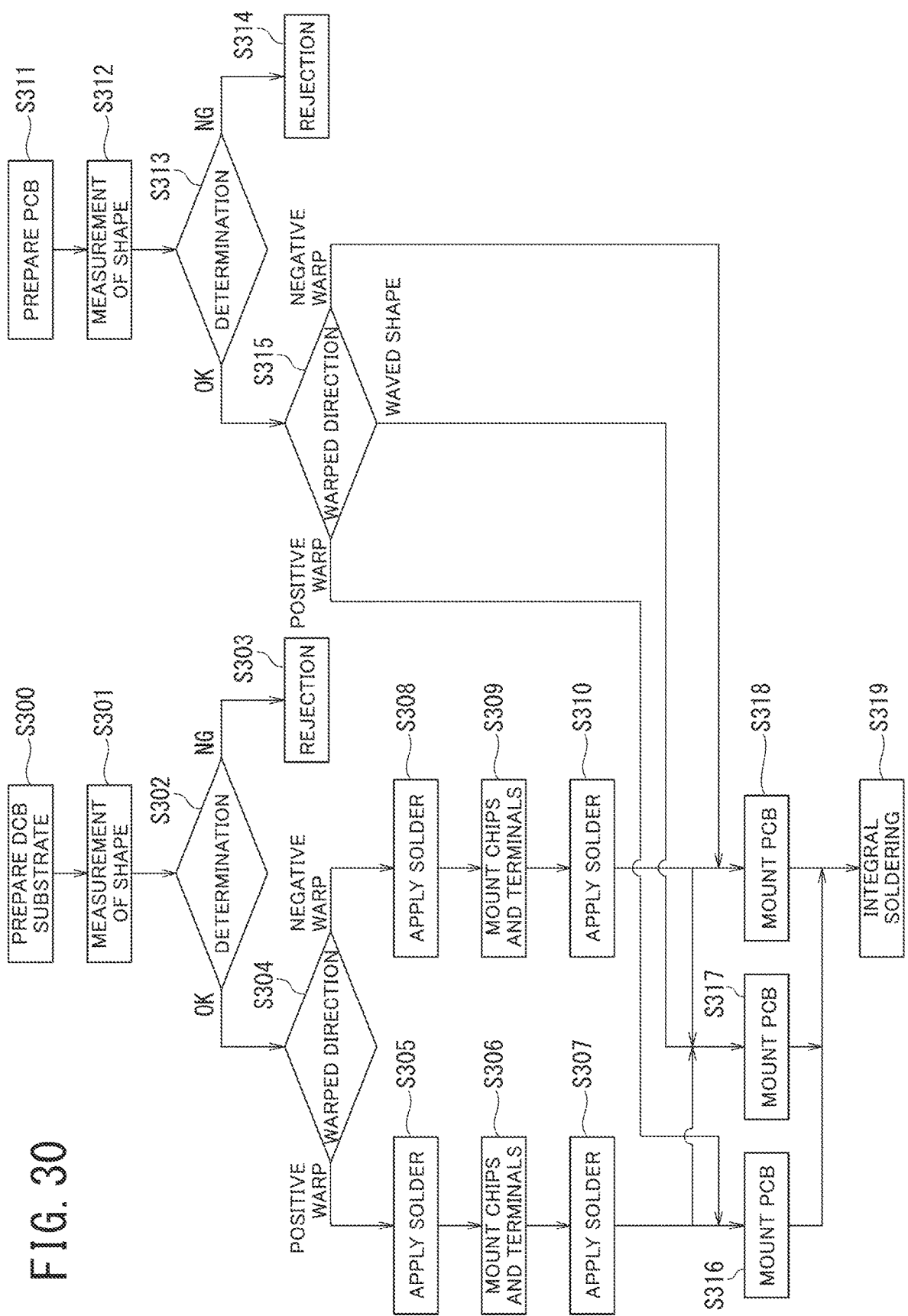
FIG. 30 is a flowchart illustrating a method of manufacturing the semiconductor device according to the second embodiment.

Next, a method of manufacturing the semiconductor device according to the second embodiment is described below with reference to the flowchart shown in FIG. 30. The method of manufacturing the semiconductor device according to the second embodiment can also use the semiconductor manufacturing apparatus illustrated in FIG. 9. The following explanations are made while referring to the reference numerals illustrated in FIG. 15.

The process in steps S300 to S314 is the same as the process in steps S100 to S114 in the method of manufacturing the semiconductor device according to the first embodiment illustrated in FIG. 13, and overlapping explanations are not repeated below.

In step S315, the controller 102 predicts the warped direction of the printed circuit board 3 when heated during the soldering step, and determines whether the predicted warp is the positive warp, the negative warp, the W-shaped warp, the M-shaped warp, or the waved shape (the N-shaped warp). The assembly unit 104 sorts the printed circuit boards 3 into the three types, the printed circuit board 3 determined to have the positive warp or the W-shaped warp when heated, the printed circuit board 3 determined to have the negative warp or the M-shaped warp when heated, and the printed circuit board 3 determined to have the waved shape when heated.

In step S316. the assembly unit 104 chooses the combination of the first insulating circuit substrate 1a and the second insulating circuit substrate 1b determined to have the positive warp when heated and the printed circuit board 3 determined to have the positive warp or the W-shaped warp when heated, and causes the printed circuit board 3 to be opposed to the respective top surfaces of the first insulating circuit substrate 1a and the second insulating circuit substrate 1b by use of a jig such as a carbon so as to mount the first pins 5a and 5b and the second pins 5c and 5d inserted to the printed circuit board 3 on the respective top surfaces of the first insulating circuit substrate 1a and the second insulating circuit substrate 1b via the bonding members 8a to 8d. The first external terminals 4a and 4b and the second external terminals 4c and 4d are inserted to the penetration holes of the printed circuit board 3.

In step S317, the assembly unit 104 chooses the combination of the first insulating circuit substrate 1a and the second insulating circuit substrate 1b determined to have the positive warp and the negative warp when heated and the printed circuit board 3 determined to be warped into the waved shape when heated, and causes the printed circuit board 3 to be opposed to the respective top surfaces of the first insulating circuit substrate 1a and the second insulating circuit substrate 1b by use of a jig such as a carbon so as to mount the first pins 5a and 5b and the second pins 5c and 5d inserted to the printed circuit board 3 on the respective top surfaces of the first insulating circuit substrate 1a and the second insulating circuit substrate 1b via the bonding members 8a to 8d. The first external terminals 4a and 4b and the second external terminals 4c and 4d are inserted to the penetration holes of the printed circuit board 3.

In step S318, the assembly unit 104 chooses the combination of the first insulating circuit substrate 1a and the second insulating circuit substrate 1b determined to have the negative warp when heated and the printed circuit board 3 determined to have the negative warp or the M-shaped warp when heated, and causes the printed circuit board 3 to be opposed to the respective top surfaces of the first insulating circuit substrate 1a and the second insulating circuit substrate 1b by use of a jig such as a carbon so as to mount the first pins 5a and 5b and the second pins 5c and 5d inserted to the printed circuit board 3 on the respective top surfaces of the first insulating circuit substrate 1a and the second insulating circuit substrate 1b via the bonding members 8a to 8d. The first external terminals 4a and 4b and the second external terminals 4c and 4d are inserted to the penetration holes of the printed circuit board 3.

In step S319, the respective substrates are entirely heated with a heating furnace at a temperature of about 200 degrees or greater and 350 degrees or lower to melt the respective bonding members 6a to 6d, 7a to 7d, and 8a to 8d so as to be integrally bonded together. This heating causes the thermal warp in each of the first insulating circuit substrate 1a, the second insulating circuit substrate 1b, and the printed circuit board 3, as illustrated in FIG. 15. Since the respective warps are complementary to each other between each of the first insulating circuit substrate 1a and the second insulating circuit substrate 1b and the printed circuit board 3, the first pins 5a and 5b and the second pins 5c and 5d and the semiconductor chips 2a to 2d can be close within a predetermined gap, so as to avoid an open fault between the first and second pins 5a to 5d and the semiconductor chips 2a to 2d. These elements are then molded with resin by use of a metal die (not illustrated), so as to complete the semiconductor device as illustrated in FIG. 15 and FIG. 17 to FIG. 20.

The method of manufacturing the semiconductor device according to the second embodiment combines the first insulating circuit substrate 1a and the second insulating circuit substrate 1b with the printed circuit board 3 having the warps complementary to each other, so as to avoid an open fault between the first and second pins 5a to 5d and the semiconductor chips 2a to 2d. The method can also use the relaxed allowable range for the warped amount upon the determination of the first insulating circuit substrate 1a and the second insulating circuit substrate 1b in step S302 and use the relaxed allowable range for the warped amount upon the determination of the printed circuit board 3 in step S313, so as to improve the yield rate.

Other Embodiments

While the present invention has been described above by reference to the first and second embodiments, it should be understood that the present invention is not intended to be limited to the descriptions and the drawings composing part of this disclosure. Various alternative embodiments, examples, and technical applications will be apparent to those skilled in the art according to this disclosure.

Figure 31:
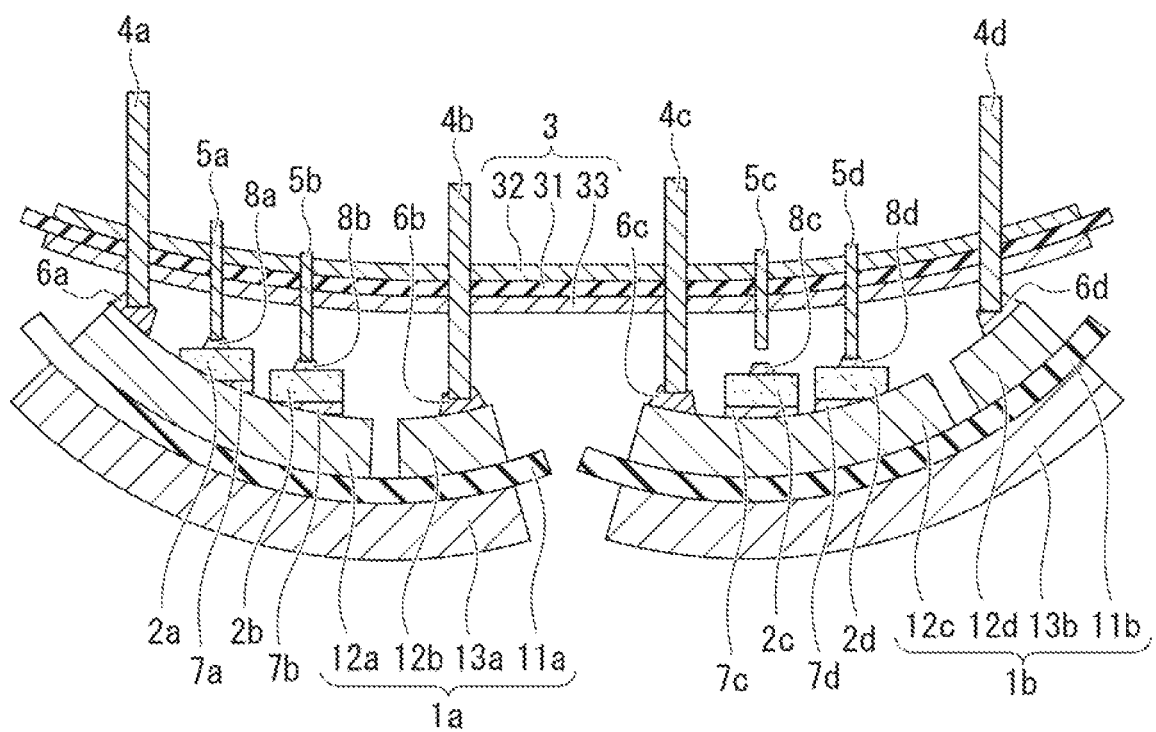
FIG. 31 is a cross-sectional view illustrating an example of a semiconductor device of a comparative example.

The second embodiment is illustrated above with the case of including the two substrates of the first insulating circuit substrate 1a and the second insulating circuit substrate 1b as illustrated in FIG. 15. The gap between each of the first insulating circuit substrate 1a and the second insulating circuit substrate 1b and the printed circuit board 3 may increase to cause an open fault if the warp of the respective substrates during the solder welding is changed more than predicted, as schematically illustrated in FIG. 31. The reason for this is that, in the case of joining each of the first insulating circuit substrate 1a and the second insulating circuit substrate 1b and the single printed circuit board 3 together, the first insulating circuit substrate 1a and the second insulating circuit substrate 1b having uneven warps (distortions) may cause inclinations when heated on a heating plate because the parts in contact with the heating plate are thermally deformed first to be heated unevenly, or the contact points with the heating plate are shifted due to a displacement of the center of gravity derived from the change in the configurations to lead to a complicated behavior of deformation during heating, which causes the gap between the printed circuit board 3 and each of the first insulating circuit substrate 1a and the second insulating circuit substrate 1b to be increased accordingly.

Figure 32A:
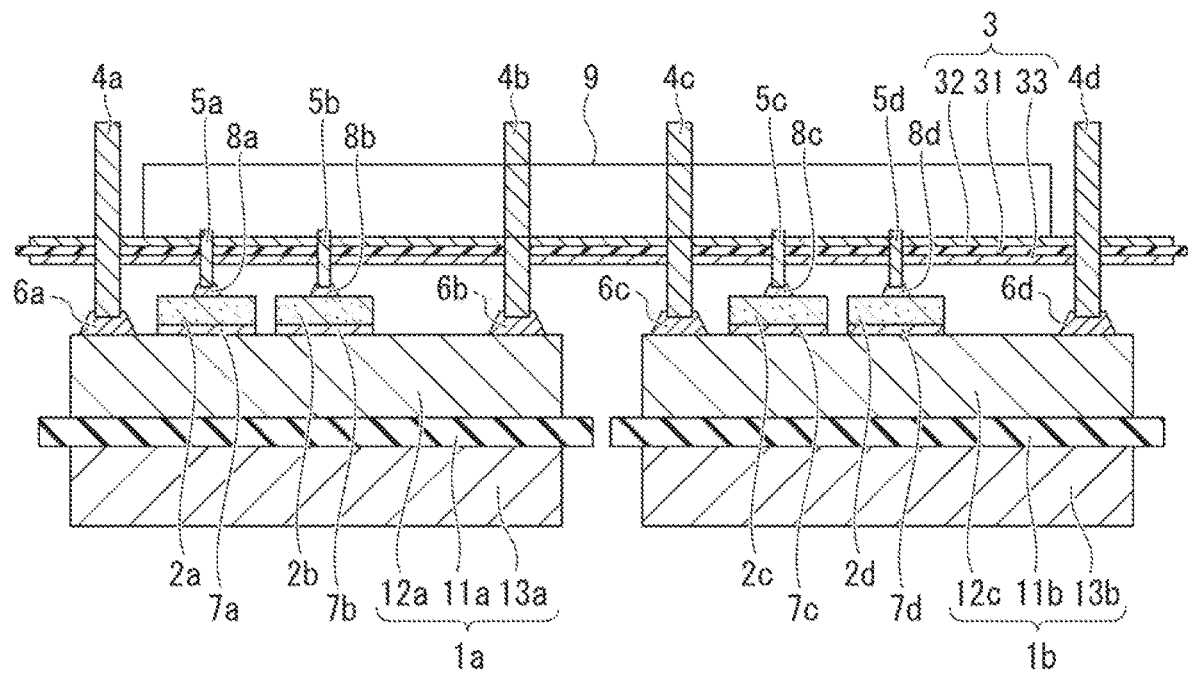
FIG. 32A is a cross-sectional view illustrating a method of manufacturing a semiconductor device according to a modified example of the second embodiment.
Figure 32B:
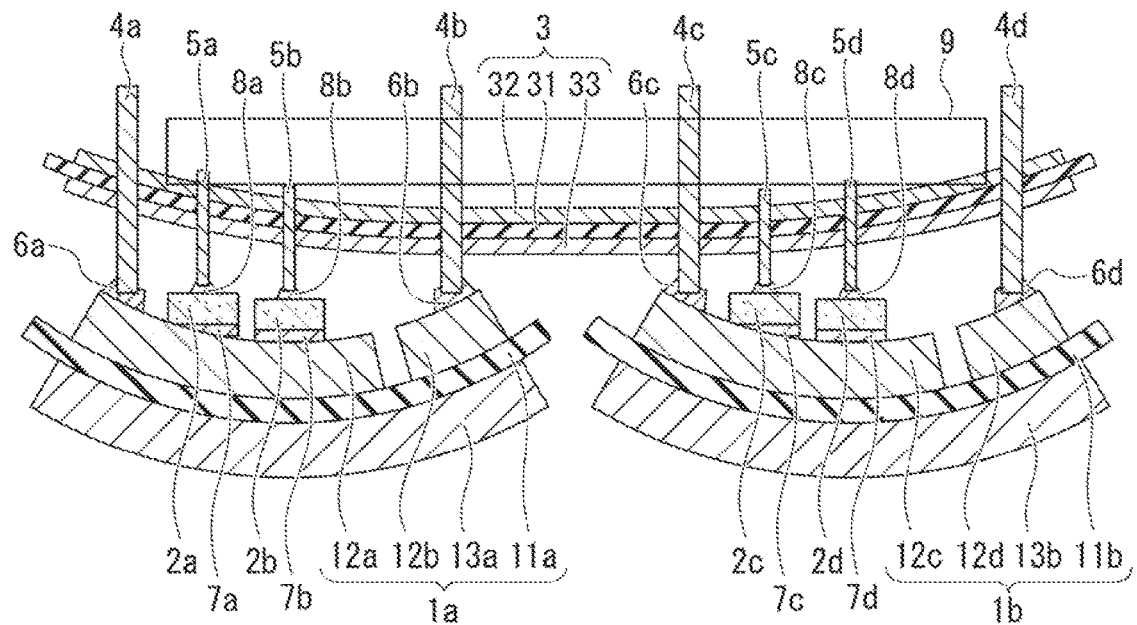
FIG. 32B is a cross-sectional view continued from FIG. 32A illustrating the method of manufacturing the semiconductor device according to the modified example of the second embodiment.
Figure 33:
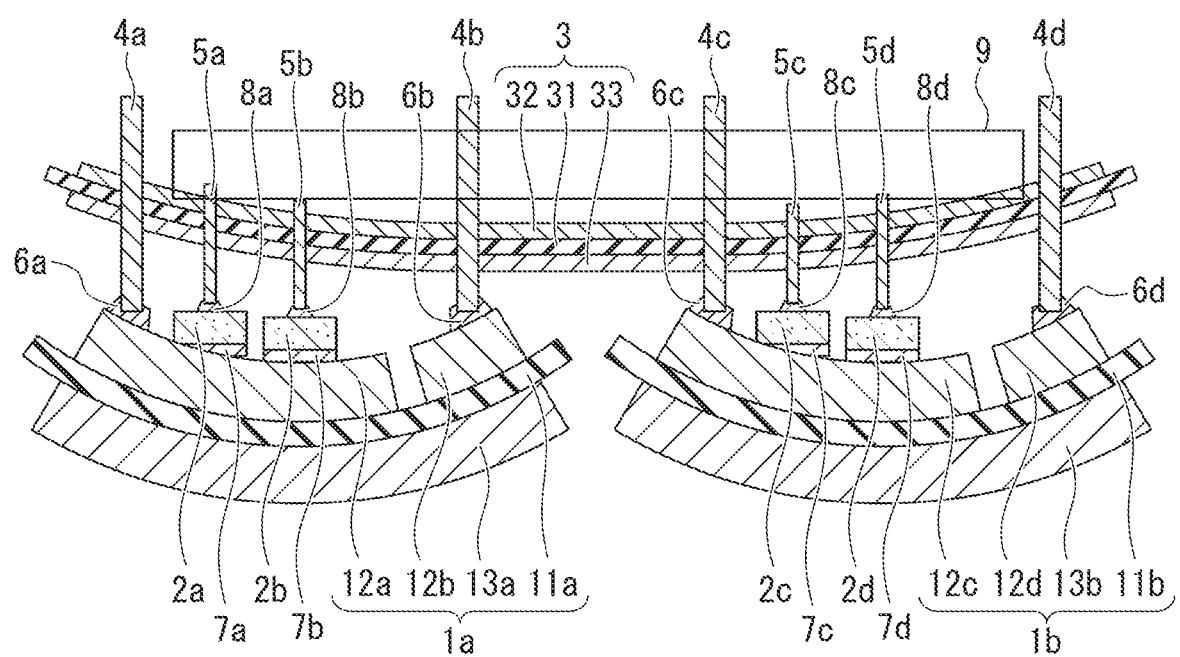

In view of this, as illustrated in FIG. 32A, a weight 9 may be placed on the printed circuit board 3 to apply a load to the printed circuit board 3 so as to press the first insulating circuit substrate 1a and the second insulating circuit substrate 1b with the printed circuit board 3. The weight 9 can reduce the inclination of the first insulating circuit substrate 1a and the second insulating circuit substrate 1b to suppress the increase in the gap between the printed circuit board 3 and each of the first insulating circuit substrate 1a and the second insulating circuit substrate 1b, as illustrated in FIG. 32B, so as to avoid an open fault.

While the first embodiment is illustrated above with the case of including the single insulating circuit substrate 1 as illustrated in FIG. 1, and the second embodiment is illustrated above with the case of including the two substrates of the first insulating circuit substrate 1a and the second insulating circuit substrate 1b as illustrated in FIG. 15, three or more of insulating circuit substrates may be arranged to be opposed to the printed circuit board. This case also only needs to choose a combination of the printed circuit board and the plural insulating circuit substrates such that the warped direction of the respective insulating circuit substrates conforms to the warped direction of the corresponding regions of the printed circuit board opposed to the respective insulating circuit substrates.

It should be understood that the present invention includes various embodiments not disclosed herein. Therefore, the technical scope of the present invention is defined only by the subject matter according to the claims reasonably derived from the foregoing descriptions.

What is claimed is:

1. A semiconductor device comprising:
   a first insulating circuit substrate;
   a first semiconductor chip mounted on a top surface of the first insulating circuit substrate;
   a printed circuit board arranged over the first insulating circuit substrate;
   a first external terminal inserted to the printed circuit board and having one end bonded to the top surface of the first insulating circuit substrate; and
   a first pin inserted to the printed circuit board and having one end bonded to a top surface of the first semiconductor chip,
   wherein the first insulating circuit substrate and the printed circuit board have warps complementary to each other.

2. The semiconductor device of claim 1, wherein the first insulating circuit substrate and the printed circuit board both have a positive warp or a negative warp.

3. The semiconductor device of claim 1, further comprising:
   a second insulating circuit substrate arranged separately from the first insulating circuit substrate;
   a second semiconductor chip mounted on a top surface of the second insulating circuit substrate;
   a second external terminal inserted to the printed circuit board and having one end bonded to the top surface of the second insulating circuit substrate; and
   a second pin inserted to the printed circuit board and having one end bonded to a top surface of the second semiconductor chip,
   wherein the second insulating circuit substrate and the printed circuit board have warps complementary to each other.

4. The semiconductor device of claim 3, wherein the first and second insulating circuit substrates and the printed circuit board have a positive warp or a negative warp.

5. The semiconductor device of claim 3, wherein:
   the first and second insulating circuit substrates both have a positive warp; and
   the printed circuit board has a W-shaped warp having downwardly convex parts opposed to the respective first and second insulating circuit substrates.

6. The semiconductor device of claim 3, wherein:
   the first and second insulating circuit substrates both have a negative warp; and
   the printed circuit board has an M-shaped warp having upwardly convex parts opposed to the respective first and second insulating circuit substrates.

7. The semiconductor device of claim 3, wherein:
   the first insulating circuit substrate has a positive warp;
   the second insulating circuit substrate has a negative warp; and
   the printed circuit board has a waved shape having a downwardly convex part opposed to the first insulating circuit substrate and an upwardly convex part opposed to the second insulating circuit substrate.

8. A semiconductor manufacturing apparatus for manufacturing a semiconductor device comprising an insulating circuit substrate, a semiconductor chip mounted on a top surface of the insulating circuit substrate, a printed circuit board arranged over the insulating circuit substrate, an external terminal inserted to the printed circuit board and having one end bonded to the top surface of the insulating circuit substrate, and a pin inserted to the printed circuit board and having one end bonded to a top surface of the semiconductor chip, the semiconductor manufacturing apparatus comprising:
   a measurement unit configured to measure a shape of a plurality of insulating circuit substrates and a shape of a plurality of printed circuit boards;
   a controller configured to predict a direction of a warp of each of the insulating circuit substrates when heated so as to bond the pin and the semiconductor chip together in accordance with a measurement result of the shape of the respective insulating circuit substrates, and predict a direction of a warp of each of the printed circuit boards when heated in accordance with a measurement result of the shape of the respective printed circuit boards; and
   an assembly unit configured to choose a combination of the insulating circuit substrate and the printed circuit board with the predicted warps complementary to each other from the plural insulating circuit substrates and the plural printed circuit boards.

9. A method of manufacturing a semiconductor device comprising an insulating circuit substrate, a semiconductor chip mounted on a top surface of the insulating circuit substrate, a printed circuit board arranged over the insulating circuit substrate, an external terminal inserted to the printed circuit board and having one end bonded to the top surface of the insulating circuit substrate, and a pin inserted to the printed circuit board and having one end bonded to a top surface of the semiconductor chip, the method comprising:

- measuring a shape of a plurality of insulating circuit substrates;
- measuring a shape of a plurality of printed circuit boards;
- predicting a direction of a warp of each of the insulating circuit substrates when heated so as to bond the pin and the semiconductor chip together in accordance with a measurement result of the shape of the respective insulating circuit substrates;
- predicting a direction of a warp of each of the printed circuit boards when heated in accordance with a measurement result of the shape of the respective printed circuit boards; and
- choosing a combination of the insulating circuit substrate and the printed circuit board with the predicted warps complementary to each other from the plural insulating circuit substrates and the plural printed circuit boards.

* * * * *